(12) United States Patent
Rogers et al.

(10) Patent No.: US 9,318,373 B2
(45) Date of Patent: Apr. 19, 2016

(54) METHOD AND APPARATUS FOR PROTECTION AGAINST PROCESS-INDUCED CHARGING

(71) Applicant: Spansion LLC, Sunnyvale, CA (US)

(72) Inventors: David M Rogers, Sunnyvale, CA (US); Mimi X Qian, Campbell, CA (US); Kwadwo A Appiah, Newark, CA (US); Mark Randolph, San Jose, CA (US); Michael A VanBuskirk, Saratoga, CA (US); Tazrien Kamal, San Jose, CA (US); Hiroyuki Kinoshita, San Jose, CA (US); Yi He, Fremont, CA (US); Wei Zheng, Santa Clara, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 13/866,915

(22) Filed: Apr. 19, 2013

(65) Prior Publication Data
US 2013/0237022 A1    Sep. 12, 2013

Related U.S. Application Data

(62) Division of application No. 11/614,053, filed on Dec. 20, 2006, now Pat. No. 8,445,966.

(51) Int. Cl.
| | |
|---|---|
| *H01L 21/768* | (2006.01) |
| *G11C 8/08* | (2006.01) |
| *G11C 8/14* | (2006.01) |
| *H01L 27/02* | (2006.01) |
| *H01L 29/66* | (2006.01) |

(52) U.S. Cl.
CPC ............... *H01L 21/768* (2013.01); *G11C 8/08* (2013.01); *G11C 8/14* (2013.01); *H01L 27/0248* (2013.01); *H01L 29/66477* (2013.01); *H01L 2924/0002* (2013.01)

(58) Field of Classification Search
None
See application file for complete search history.

(56) References Cited

U.S. PATENT DOCUMENTS

| | | |
|---|---|---|
| 5,393,701 A | 2/1995 | Ko et al. |
| 5,514,623 A | 5/1996 | Ko et al. |
| 5,691,234 A | 11/1997 | Su et al. |
| 5,963,412 A | 10/1999 | En |
| 5,986,308 A | 11/1999 | Gradenwitz |
| 5,986,515 A * | 11/1999 | Sakurai ..................... 331/176 |
| 5,998,299 A | 12/1999 | Krishnan |

(Continued)

OTHER PUBLICATIONS

Wang, Z., et al.: "Strategies to Cope with Plasma Charging Damage in Design and Layout Phases", IEEE International Conference on Integrated Circuits and Technology—Digest of Technical Papers, pp. 91-98, 2005.

(Continued)

*Primary Examiner* — Bilkis Jahan
*Assistant Examiner* — Kevin Quinto

(57) ABSTRACT

A semiconductor device (400) for improved charge dissipation protection includes a substrate (426), a layer of semiconductive or conductive material (406), one or more thin film devices (408) and a charge passage device (414). The thin film devices (408) are connected to the semiconductive or conductive layer (406) and the charge passage device (414) is coupled to the thin film devices (408) and to the substrate (426) and provides a connection from the thin film devices (408) to the substrate (426) to dissipate charge from the semiconductive/conductive layer (406) to the substrate (426).

21 Claims, 20 Drawing Sheets

(56) References Cited

U.S. PATENT DOCUMENTS

| | | | |
|---|---|---|---|
| 6,013,927 | A | 1/2000 | Bothra et al. |
| 6,093,626 | A | 7/2000 | Su et al. |
| 6,277,708 | B1 | 8/2001 | Bothra et al. |
| 6,329,691 | B1 | 12/2001 | Finzi |
| 6,337,502 | B1 * | 1/2002 | Eitan et al. .................... 257/357 |
| 6,432,726 | B2 | 8/2002 | Iranmanesh |
| 6,448,599 | B1 | 9/2002 | Wang |
| 6,639,286 | B2 | 10/2003 | Iranmanesh |
| 6,686,254 | B2 | 2/2004 | Petrucci et al. |
| 2005/0250278 | A1 | 11/2005 | Randolph |

OTHER PUBLICATIONS

Krishnan, S., et al.: "Antenna Protection Strategy for Ultra-Thin Gate MOSFETs", IEEE International Reliability Physics Symposium—Digest of Technical Papers, pp. 302-306, 1998.

Shin, H., et al.: "Impact of Plasma Charging Damage and Diode Protection on Scaled Thin Oxide", IEEE International Electron Device Meeting—Digest of Technical Papers, pp. 467-70 (18.3, 1-18.3.4), 1993.

Carrere, J., et al.: "Charging Protection and Degradation by Antenna Environment on NMOS and PMOS Transistors", International Symposium on Plasma Process-Induced Damage—Digest of Technical Papers, pp. 184-187, 1999.

Krishnan, S., et al.: "Antenna Device Reliablity for ULSI Processing", IEEE International Electron Device Meeting—Digest of Technical Papers, pp. 601-604 (21.5.1-21.5.4), 1998.

Andrews, P., et al.: "CMOS-Circuit Protection Against PPID for Yield Enhancement", International Symposium on Plasma Process-Induced Damag—Digest of Technical Papers, pp. 167-70, 1997.

Amerasakera, A., et al.: "ESD Protection Design and Application to Bidirectional Antenna Protection for Sub-5 nm Gate Oxides", International Symposium on Plasma Process-Induced Damage—Digest of Technical Papers, pp. 33-37, 1997.

Krishnan, S., et al.: "Inductively Coupled Plasma (ICP) Metal Etch Damage to 35-60 Gate Oxide", IEEE International Electron Device Meeting—Digest of Technical Papers pp. 731-734, 1996.

USPTO Final Rejection for U.S. Appl. No. 11/614,053 dated Jun. 10, 2010; 12 pages.

USPTO Final Rejection for U.S. Appl. No. 11/614,053 dated Sep. 17, 2009; 8 pages.

USPTO Final Rejection for U.S. Appl. No. 11/614,053 dated Nov. 22, 2011; 10 pages.

USPTO Non-Final Rejection for U.S. Appl. No. 11/614,053 dated Jan. 22, 2010; 11 pages.

USPTO Non-Final Rejection for U.S. Appl. No. 11/614,053 dated Mar. 6, 2009; 8 pages.

USPTO Non-Final Rejection for U.S. Appl. No. 11/614,053 dated Jun. 7, 2011; 12 pages.

USPTO Notice of Allowance for U.S. Appl. No. 11/614,053 dated Feb. 21, 2013; 8 pages.

* cited by examiner

METHOD AND APPARATUS FOR PROTECTION AGAINST PROCESS-INDUCED CHARGING

CROSS-REFERENCE TO RELATED APPLICATION

This application is a divisional of U.S. patent application Ser. No. 11/614,053, filed on Dec. 20, 2006, entitled "Method and Apparatus for Protection Against Process Induced Charging," which is hereby incorporated herein by reference in their entirety.

FIELD OF THE DISCLOSURE

The present invention generally relates to semiconductor devices, and more particularly relates to a method and apparatus for protection of nodes of sensitive semiconductor devices against process-induced charging.

BACKGROUND OF THE DISCLOSURE

In-process charging of gate electrodes in insulated gate field effect transistors (IGFETs) can damage the gate dielectrics of the transistors. In the most common form of IGFET, the modern MOSFET (metal-oxide-semiconductor field-effect transistor), the gate electrode is formed from polysilicon. In a MOSFET, in-process charging commonly occurs during the etching of the MOSFET's polysilicon gate. Charging of a polysilicon gate can also occur during the processing of layers subsequent to the processing of the polysilicon gate when those subsequent layers are electrically connected to the polysilicon gate. These subsequent layers are typically contact layers, other polysilicon layers and metal layers.

In a MOSFET, the in-process charging of the gate causes large voltages and large electric fields to occur across the gate dielectric of the MOSFET. This gate dielectric is commonly silicon dioxide. Large electric fields across the gate dielectric can cause small tunneling currents to flow through the dielectric and the tunneling currents can leave charge trapped in the dielectric. This dielectric charge can alter the threshold voltage of the MOSFET and can also change other device characteristics. Electric fields can sometimes also be large enough to cause gate to substrate breakdown or, where a doped well resides in the substrate, gate to well breakdown. Gate dielectric charging and gate to substrate or gate to well breakdown can each result in product failure.

Thus, what is needed is a method and apparatus for charge dissipation protection which prevents a conductive or semiconductive material such as polysilicon from accumulating damaging levels of charge during semiconductor fabrication. Furthermore, other desirable features and characteristics of the present invention will become apparent from the subsequent detailed description of the invention and the appended claims, taken in conjunction with the accompanying drawings and this background of the invention.

SUMMARY OF THE DISCLOSURE

A semiconductor device for improved charge dissipation protection includes a substrate, a layer of semiconductive or conductive material, one or more thin film devices and a charge passage device. The thin film devices are connected to the semiconductive/conductive layer and the charge passage device is coupled to the thin film devices and to the substrate and provides a connection from the thin film devices to the substrate to dissipate charge from the semiconductive/conductive layer to the substrate.

A method for forming a semiconductor device with improved charge dissipation includes the steps of providing a substrate, forming a charge passage device coupled to the substrate, forming one or more thin film devices coupled to the charge passage device, and forming a semiconductive or conductive layer connected to the thin film devices such that in-process charges forming in the semiconductive/conductive layer during processing will be dissipated to the substrate through a connection to the substrate provided by the thin film devices and the charge passage device.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
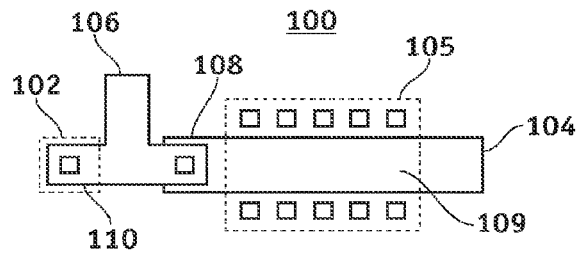
FIG. 1 is a layout diagram of a conventional charge dissipation protection structure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Before describing in detail embodiments that are in accordance with the present invention, it should be observed that the embodiments reside primarily in combinations of method steps and apparatus components related to protection against process-induced charges. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," or "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

In MOSFET technologies, charge dissipation protection structures provide methods for preventing the polysilicon that forms MOSFET gates from accumulating damaging levels of charge during product fabrication. Referring to FIG. 1, a semiconductor device 100 includes a conventional charge dissipation protection structure including a gate protection diode 102 connected from a polysilicon gate electrode 104 in MOSFET transistors with sources and drains 105 via a metal connector 106 to the substrate. In the cases of transistors residing in doped wells, the gate protection diode 102 typically connects the gate electrode 104 to the well. The gate protection diode 102 resides in the substrate (or in doped wells that reside in the substrate) underlying the gate dielectric 109. The gate dielectric 109 resides between the gate electrode 104 and the portion of the substrate (or the portion of a doped well) that forms the transistor's semiconducting channel. During normal operation when the transistor is turned on and is in its conducting state the semiconducting channel electrically connects the transistor's drain to its source (i.e., sources and drains 105). The gate protection diode 102 is formed by doping the substrate (for example, an N+ dopant could be used in a P doped substrate to form the gate protection diode 102). The gate protection diodes 102 are normally reversed biased during product operation. In-process charging can cause the diodes 102 to forward bias or to reverse bias during circuit fabrication. Normally, process-induced charge is small enough that even the relatively small reverse saturation currents in the diodes 102 are large enough to adequately dissipate gate charges induced during processing.

This conventional charge dissipation protection structure has several drawbacks. First, in most processes, the first interconnect layer to be electrically isolated from the substrate is a polysilicon layer used for the MOSFET gate electrodes 104. In such semiconductor devices, charge cannot be dissipated from the polysilicon layer until after contacts are made to the polysilicon layer and those contacts are then connected through a connection 106 in the semiconductor device's first metal layer to the charge dissipating gate protection diodes 102. This first metal layer is normally created after the polysilicon layer. In such situations, charge that occurs on the MOSFET polysilicon gate electrodes 104 during polysilicon processing (such as during polysilicon etching) and during contact formation is not dissipated except through the gate dielectrics 109 of the MOSFETs themselves. In short, there is normally no charge-dissipating protection until the first metal layer (or other interconnect layer) after the polysilicon is created.

A second drawback to the conventional charge dissipation protection structures is that the conventional charge dissipation protection structures require substantial layout space to create. At a minimum, the conventional charge dissipation protection structures require the area of a contact 108 from each polysilicon gate 104 or from each group of common-connected polysilicon gates 104 to the metal interconnect 106, the area of the metal interconnect 106, the area of a contact 110 from the metal interconnect to one of the diffused source-drain regions that form the diode 102, and the area of the protection diode 102, the source-drain regions and the protection diode 102 occupying space in the substrate or in doped wells in the substrate. Thus, as is well-known to those skilled in the art, conventional charge dissipation protection structures require significant layout space.

This drawback of the conventional charge dissipation protection structures is magnified in semiconductor devices wherein large numbers of different, not commonly-connected polysilicon gate electrodes 104 are formed in a relatively small area, such as in memory arrays with a large number of word-lines (gates) in an array.

To address the charging problems and charge-induced damage problems that would otherwise occur during gate layer etch (commonly during polysilicon layer etch) and during subsequent layer etch steps, charge dissipation protection structures in accordance with embodiments of the present invention are formed earlier in the processing of the semiconductor device than the conventional charge dissipation protection structures. In addition, charge dissipation protection structures in accordance with embodiments of the present invention also use less layout space than the conventional charge dissipation protection structures.

Figure 2:
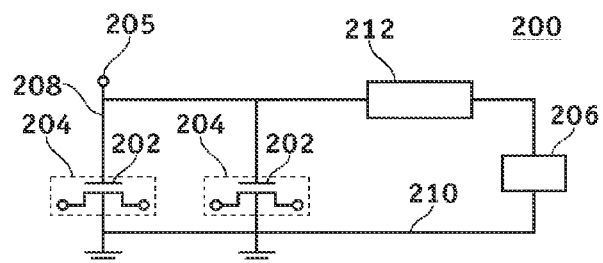
FIG. 2 is a schematic diagram overview of a charge dissipation protection circuit in accordance with the present invention.

Referring to FIG. 2, a semiconductor device 200 in accordance with the present invention provides charge dissipation protection for thin film gate electrodes 202 (such as polysilicon gate electrodes) of numerous transistors 204 connected to a common node 205 using a single charge passage device 206 to pass charge from the thin film polysilicon layer 208 to the substrate 210. In this manner, the function of conventional charge dissipation methods' substrate-resident, well-resident, or buried contact to substrate interface-resident charge dissipation diodes with devices resident in the poly-silicon thin film are replaced. In the semiconductor device 200, the replacement devices 212 are high impedance thin film resistors solely in the polysilicon 208 or high impedance thin film diodes solely in the polysilicon 208. These thin film devices 212 then pass charge from the thin film polysilicon layer 208 to the substrate 210 via the charge-passage device 206. In addition to protection of the thin film gate electrodes 202 such as those in the polysilicon of the semiconductor device 200, the charge dissipation protection scheme in accordance with the present invention could provide protection for semiconductive and conductive materials other than polysilicon and could provide protection for structures such as thin film gate or gate-like nodes in other types of semiconductor technologies.

Figure 3:
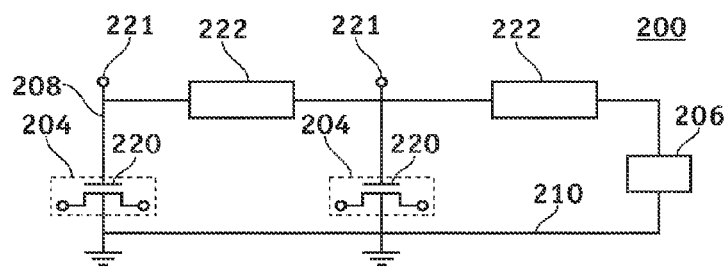
FIG. 3 is a schematic diagram overview of an alternate charge dissipation protection circuit in accordance with the present invention.

Referring to FIG. 3, an alternate embodiment of the semiconductor device 200 in accordance with the present invention provides charge dissipation protection for the thin film gate electrodes (such as polysilicon gate electrodes) of numerous transistors 204 that have non-common gate electrodes 220, using the single charge passage device 206 to pass charge from the thin film polysilicon layer 208 to the substrate 210. The non-common gate electrodes 220 are connected to different nodes 221. Between the gate electrodes 221 are high impedance thin film devices 222 solely in the polysilicon 208, such as high impedance thin film resistors or high impedance thin film diodes.

In accordance with one embodiment, the semiconductor device 200 could be a memory device comprising a plurality of memory cells, each cell being either a single-bit memory cell or a multi-bit memory cell. One example of a multi-bit per cell memory device is a MirrorBit® memory device manufactured by Spansion, LLC of Sunnyvale, Calif., the assignee of the present patent. A MirrorBit memory device is a non-volatile, electrically programmable memory device wherein two bits may be stored in two localized areas of a single memory cell. As in many memory devices, a MirrorBit memory cell includes a gate electrode formed of a thin film semiconductive material, the thin film gate electrode material being connected to gate electrodes of other memory cells by word lines. In accordance with the present invention, the thin film word lines can be protected from in-process charging without impacting the performance of the memory devices, i.e., the charge dissipation protection structures can dissipate charging of the gate electrodes during processing while, during normal operation, function primarily as open circuits, such as in the presence of positive and negative voltage polarities provided across the protection structures. For example, in MirrorBit memory devices, positive voltages are applied to the word lines during programming and read operations and negative voltages are applied to the word lines during erase operations.

The semiconductor device 200 advantageously provides one single charge passage device for passing charge from a multitude of gate electrodes to the substrate rather than the conventional solution of providing one charge passage device per gate electrode. The semiconductor device 200 moreover can provide charge dissipation protection for multiple non-common gates 220, i.e., gates 220 connected to different nodes 221, using a single charge passage device 206 to pass charge from the polysilicon thin film layer 208 to the substrate 210 or to a doped well residing in the substrate 210. In addition, the semiconductor device 200 advantageously provides charge dissipation protection immediately at the onset of polysilicon layer processing rather than the conventional solution of not providing protection until the first contact and metal layer step after polysilicon processing because the thin film high impedance devices 212, 222 are fabricated from the same thin film semiconductive material 208 as the gate electrodes 202, 220.

The essential elements of the charge dissipation protection structure of the semiconductor device 200 are one or more thin film devices 212, 222 and a single charge passage device 206. The one or more thin film devices 212, 222 are comprised of thin film high impedance charge leakage devices 212, 222 which transport charge from a first portion of a piece of semiconductive material 208, such as polysilicon, that is to be protected, such as the gate 220 of a MOSFET transistor 204 or gates 202 of a group of MOSFET transistors 204 sharing the same gate node 205, to a second portion of the same piece of semiconductive material 208. Charge can then be dissipated from this second piece of the semiconductive material 208 into the underlying substrate 210 or underlying doped well. The thin film high impedance charge leakage devices 212, 222 have large enough impedances that, during normal product operation, they effectively electrically isolate the second portion of the piece of semiconductive material 208 from the first portion.

Despite the relatively high impedances of the thin film charge leakage devices 212, 222, though, the impedances of these one or more thin film devices 212, 222 are designed to still be low enough to allow the one or more devices 212, 222 to pass enough charge during processing to allow the devices 212, 222 to provide adequate protection for the gate electrodes 202, 220 against process-induced charging. This is because the currents needed to dissipate process-induced charges are very small compared with the currents that would be considered appreciable during normal product operation. In the semiconductor device 200 in accordance with the present invention, these thin film high impedance charge leakage devices 212, 222 take the form of high impedance thin film diodes or high impedance thin film resistors.

Once charge passes from the first portion of a piece of the semiconductive material through the thin film high impedance charge leakage device(s) 212, 222 to the second portion of a piece of the semiconductive material, the charge is then passed from the thin film layer (e.g., polysilicon layer 208) to the substrate 210 or to a doped well residing in the substrate 210. Devices used for conducting charge from the thin film layers 208 to the substrate 210 or to doped wells are termed herein charge passage devices 206.

In accordance with the present invention, one component of the charge passage device 206 is the above-mentioned second portion of the piece of semiconductive material. Charge passage devices 206 may be gate oxide capacitors connecting the semiconductive material 208 to the substrate 210 or to a doped well in the substrate 210. Alternatively, the charge passage devices 206 may be buried contacts from the second portion of the piece of semiconductive material 208 to the underlying substrate 210 or to a doped well residing in the underlying substrate 210.

Thus, a thin film high impedance charge leakage device 212, 222 connects the semiconductive material of the gates 202, 220 of the transistors 204 being protected directly or indirectly to the semiconductive material connected to a charge passage device 206. The charge passage device 206 then passes the charge from the semiconductive material 208 to the underlying substrate 210 or to an underlying doped well.

Figure 4:
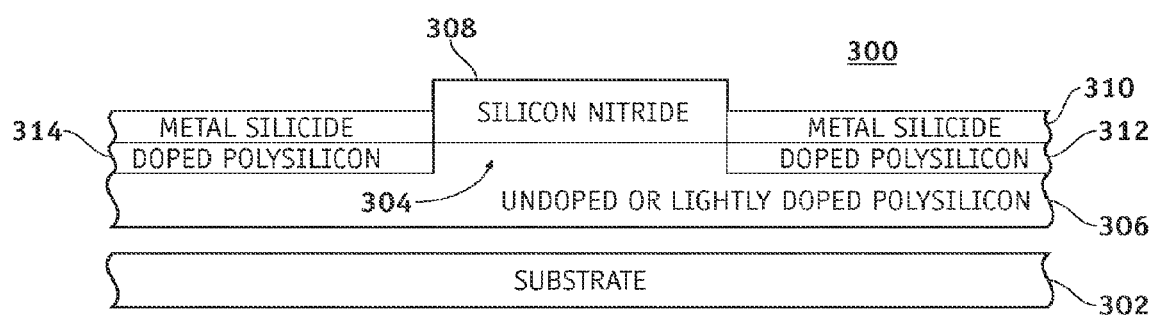
FIG. 4 is a cross-sectional view of a semiconductive layer during processing in accordance with the present invention.

Referring to FIG. 4, a cross-section of a semiconductor device 300 during fabrication in accordance with the present invention is depicted. A substrate 302 is provided and one or more thin film devices can be formed in a portion 304 of the undoped or lightly doped polysilicon (i.e., semiconductive) layer 306 by masking such portion 304 with a mask layer 308 to block the portion 304 of the poly-silicon from being doped with additional impurities (forming mask 308 prior to ion implantation) and by preventing the portion 304 of the poly-silicon from having metal silicide 310 deposited on top thereof. Thus, the doped polysilicon 312, 314 can have a reduced impedance thereby permitting currents to easily pass therethrough. In this manner, high impedance resistors having resistances on the order of ten to one hundred mega-ohms can be formed by limiting the doping in portions of the poly-silicon 304 (the resistors) to small amounts. Even higher levels of resistance can be attained when no impurities are allowed to dope the portion 304 of the polysilicon. The background impurity levels in the polysilicon layer 306 can be adjusted via masked ion implants or blanket ion implants of the polysilicon to optimize values of resistor impedances for protection against in-process charging and for correct circuit functioning during normal circuit operation.

Use of the same mask layer 308 to pattern the region 304 of the polysilicon that is blocked from additional ion implant and to pattern the region 304 of the polysilicon that does not have metal silicide deposited thereon can advantageously be accomplished by using the same silicon nitride ($Si_3N_4$) layer 308 to define the mask used to pattern the regions of poly-silicon that have metal silicide blocked as well as patterning the regions of the poly-silicon that are not additionally doped. The silicon nitride layer 308 both blocks the formation of metal silicide 310 on the undoped or lightly doped polysilicon 306 and blocks the ion implant that would otherwise dope the polysilicon 312, 314 and, therefore, provides the advantages of only requiring a single mask step for patterning the high impedance thin film devices 304 and self-aligning the not additionally doped portion 304 of the undoped or lightly doped polysilicon 306 with the portion 304 which is non-metal silicided. With an additional mask step (typical already extant in most technologies), differing polarities of impurities (acceptor impurities and donor impurities) can be used to dope different regions 312, 314 of the doped silicon. By doping one region of polysilicon 312 with donor impurities and a second region 314 with acceptor impurities and separating the two regions with an undoped region 304, a high impedance P+/Insulator/N+ (PIN) diode can be formed in the thin film. As with the thin film resistors, adjusting the background impurity levels in the polysilicon layer 306 can be done in order to attain optimum impedance levels in the PIN diode. In some devices it is advantageous to create high impedance thin film PIN diodes rather than high impedance resistors. Diodes can sometimes be used, for example, in cases in which, for reasons unrelated to charging protection, two portions of the polysilicon must be doped with opposite polarities of dopants. In such cases, PIN diodes connecting two such portions can often require less area to implement than can high impedance resistors connecting those same two portions.

Figure 5:
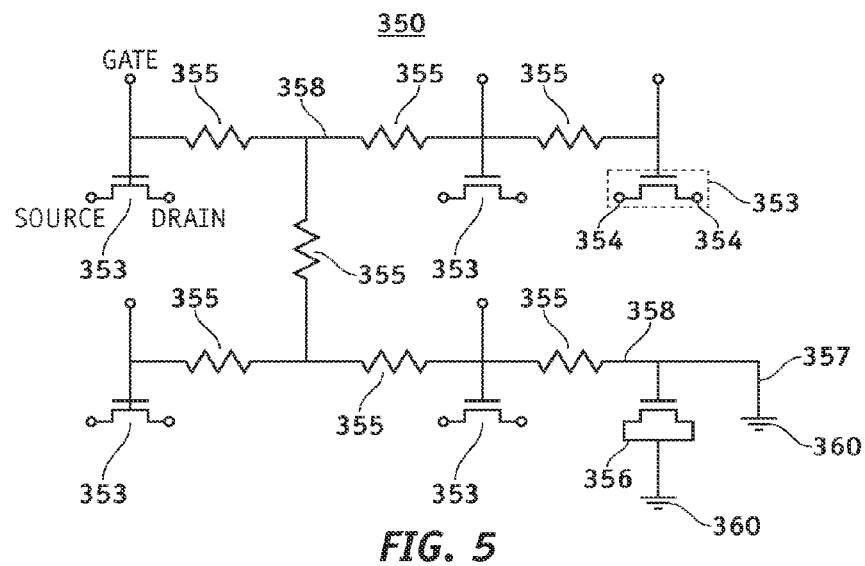
FIG. 5 is a schematic diagram of a charge dissipation protection circuit in accordance with an embodiment of the present invention.
Figure 6:
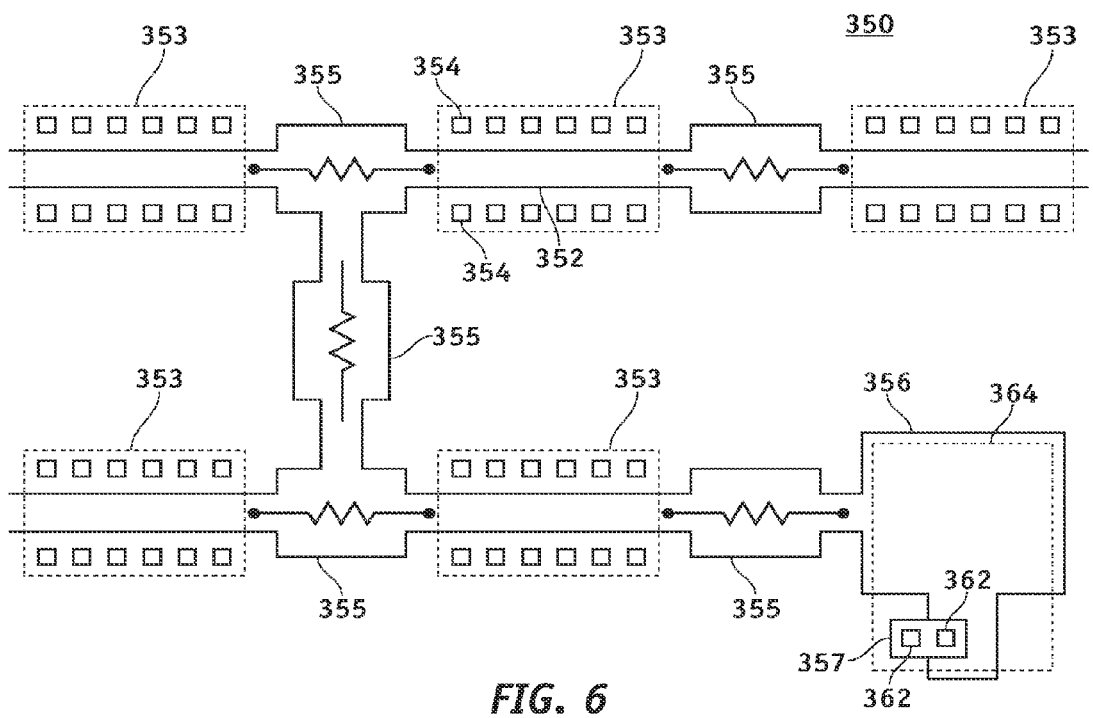
FIG. 6 is a layout view of a charge dissipation protection circuit in accordance with the embodiment of the present invention depicted in FIG. 5.

Referring to FIGS. 5 and 6, a semiconductor device 350 having a charge dissipation protection structure is depicted. FIG. 5 is a schematic diagram showing a number of gate electrodes 352 (G1, G2, G3, G4 and G5) of transistors 353 (including gate electrodes 352 and source-drains 354) connected through a number of high impedance thin film poly-silicon resistors 355 to a charge passage device 356. The transistors 353 have different gate nodes connected to each other through the high impedance resistors 355, all of the transistors 353 protected with a single charge passage device 356 and a single polysilicon grounding connection 357, thereby saving substantial layout space.

The charge passage device 356 dissipates gate charge from the thin film layer 358 in which the gate electrodes 352 and the high impedance resistors 355 are formed to the substrate 360 underlying the transistors 352. FIG. 6 is layout depiction of the portion of the semiconductor device 350 depicted in the schematic diagram of FIG. 5 wherein the contacts 362 are connected to the substrate 360. The portion of the semiconductor device 350 shown in FIGS. 5 and 6 preferably includes peripheral transistors 353 that are logic circuit transistors or analog circuit transistors making up standard complementary metal-oxide semiconductor (CMOS) circuitry.

The charge passage device 356 is formed by creating a thin gate oxide from the polysilicon 358 to the substrate 360. The low voltage thin gate oxide is formed by depositing polysilicon over the source-drains in the substrate 360 and provides a path for charge to leak (i.e., tunnel) from the polysilicon to ground. In this manner, the thin gate oxide charge passage device 356 exists before the polysilicon 358 is etched, thereby providing charge dissipation protection during the polysilicon etch. The oxide thickness of the charge passage device 356 is preferably thinner than the oxide in the transistor gates 352, such as thirty nine Angstroms (39 Å). Nevertheless, forming the charge passage device 356 having an oxide layer with the same thickness as the oxides in the transistor gates 352 still provides ample charge dissipation protection. Providing a thinner oxide layer for the charge passage device 356 than the oxide layer of the transistor gates 352 being protected by the charge passage device 356 provides particularly effective charge dissipation protection and, though problematic in some fabrication processes, is practical in fabrication processes using several different oxide thicknesses. While the charge passage device 356 described hereinabove is a thin low voltage gate oxide device, any device that can pass charge from the polysilicon 358 to the substrate 360 could be used as a polysilicon to substrate charge passage device 356 and, when used in conjunction with the high impedance charge leakage thin film devices 355 formed in the polysilicon 358 provide a charge dissipation protection structure in accordance with the present invention which provides substantial protection against process-induced charging for the thin film polysilicon layer 358.

Having the charge passage device 356 reduces the polysilicon layer's 358 "antennae ratio". This ratio is defined for a single piece of polysilicon as the total area of the piece of polysilicon divided by the sum of the areas of the thin oxide regions between the substrate (or doped well) and that piece of polysilicon. The effects of process-induced charging are much greater and, consequently, much more harmful, when the antennae ratio associated with the piece of poly-silicon is much larger than one. Accordingly, providing the charge passage device 356 reduces the antenna ratio which, in turn, renders the semiconductor device 350 much less susceptible to the effects of process-induced charging.

As described above, the charge passage device 356 is a low voltage thin gate dielectric that is formed between the polysilicon 358 and an underlying layer of source-drain region in the substrate 360 (i.e., the type of substrate region used to form the sources, drains and channels of some of the technology's MOSFETs). The dielectric in the charge passage device 356 is advantageously formed thin enough that the dielectric allows charge to tunnel through it or to pass through it in a dielectric breakdown mode to dissipate any process-induced charges from the polysilicon layer 358 to the substrate 360. Such charge tunneling may damage the dielectric of the charge passage device 356; however such damage is not problematic because the dielectric could even become a short circuit and the semiconductor device 350 will still function as designed. In fact, in accordance with the present invention, shorting the thin dielectric would advantageously pass process-induced charge without having any negative consequence to operation or reliability of the semiconductor device 350. In addition, the charge passage device 356 is formed at the time that the polysilicon layer 358 is formed, thereby providing a thin gate charge passage device 356 that is capable of passing and dissipating process-induced charge as soon as deposition of the polysilicon layer 358 begins in the process of fabricating the semiconductor device 350.

The low voltage thin gate dielectric charge passage device 356 is augmented by an electrically parallel secondary polysilicon to substrate charge passage device 357. Polysilicon to ground connections are provided by the secondary charge passage device's 357 connections via metal, contacts and source-drain from the polysilicon 358 to the substrate 360 or to a doped well residing in the substrate 360. The secondary charge passage device 357 is formed subsequent to the polysilicon deposition process step. After its formation in the first metallization step, the secondary charge passage device 357 provides added charge dissipation protection by dissipating charge during the first metal etch step and during all subsequent process steps. The secondary charge passage device 357 used in parallel with the thin dielectric charge passage device 356 reduces the combined impedance of the polysilicon to substrate charge passage devices once the secondary charge passage device 357 is formed during processing.

The secondary charge passage device 357 is formed from one or more contacts from the polysilicon 358 to the first layer of metal combined with one or more contacts from that layer of metal to the substrate 360. Once the first layer of metal is deposited, the impedance of the combined polysilicon to substrate charge passage device 356, 357 is very low, providing improved charge dissipation protection. Furthermore, while the impedance of the thin dielectric polysilicon to substrate charge passage device 356 is low enough to allow the charge passage device 356 to provide effective protection against process-induced charging during polysilicon deposition, during polysilicon etching and during formation of contacts to the polysilicon, adding the secondary charge passage device 357 ensures adequate protection during metal deposition, metal etching and subsequent processing steps, processing steps that typically have more process-induced charging associated with them than the thin dielectric charge passage device 356 may effectively dissipate.

In an alternative embodiment of the present invention, the charge passage device can be formed from simple links between the polysilicon and the substrate via contacts 362 from metal lines 357 to the polysilicon 358 and then contacts from the metal lines 357 to the substrate 360. Although this embodiment does not provide protection before the deposition of the first metal layer, thereafter the charge passage device would provide a charge dissipation protection structure which requires less layout area on the semiconductor die than a conventional charge dissipation protection structure.

Figure 7:
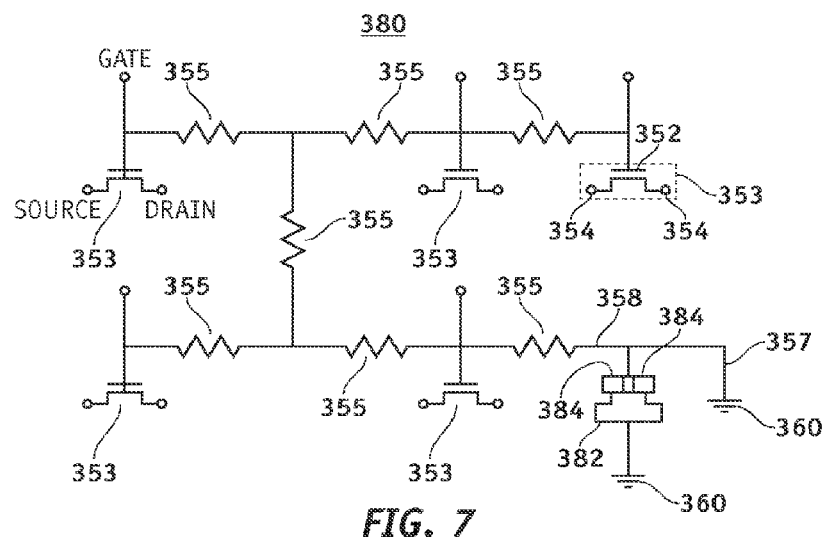
FIG. 7 is a schematic diagram of a charge dissipation protection circuit in accordance with an alternate embodiment of the present invention.
Figure 8:
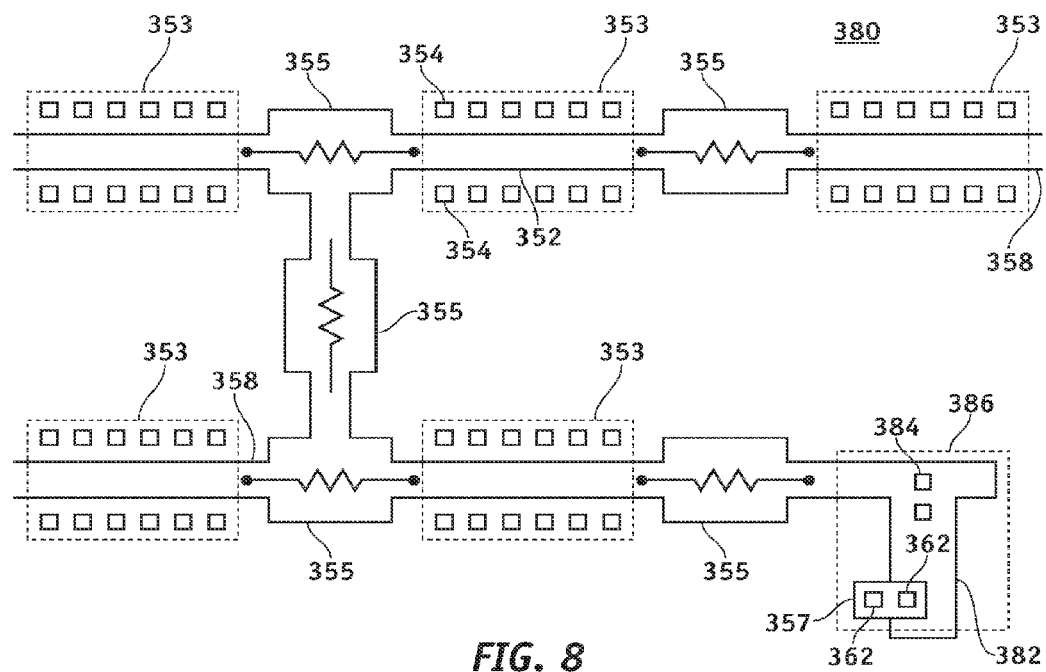
FIG. 8 is a layout view of a charge dissipation protection circuit in accordance with the alternate embodiment of the present invention depicted in FIG. 7.

Referring to FIGS. 7 and 8, FIG. 7 depicts a schematic diagram and FIG. 8 depicts a layout diagram of a charge dissipation structure in a semiconductor device 380 in accordance with yet another alternate embodiment of the present invention. The charge dissipation structure of the semiconductor device 380 differs from the charge dissipation structure of the semiconductor device 350 depicted in FIGS. 5 and 6 in that the charge passage device 382, rather than being a thin oxide tunneling device 356 (FIGS. 5 and 6), includes one or more buried contacts 384. The buried contacts 384 directly connect the polysilicon 358 to an underlying source-drain region 386 (FIG. 8) residing in the substrate 360 or residing in a doped well formed in the substrate 360. For semiconductor devices 380 which accommodate the use of buried contacts 384, a charge dissipation protection structure in accordance with this alternate embodiment of the present invention is extremely effective. Like the thin gate dielectric charge passage device 356 (FIGS. 5 and 6), a charge passage device 382 including buried contacts 384 would have the advantage of already existing and of being available to pass and dissipate process-induced charge as soon as the polysilicon layer 358 deposition begins. In addition, when properly optimized, the charge dissipation protection structure in accordance with the alternate embodiment of the present invention depicted in FIGS. 7 and 8 could potentially alleviate all problems caused by in-process charging while also requiring less layout space than conventional charge dissipation protection structures.

Referring to FIGS. 9 to 36, embodiments of the present invention in a MirrorBit memory device wherein polysilicon gate electrodes function as memory word lines are depicted and charge dissipation protection structures suitable for protecting MirrorBit core transistors from accumulating damaging amounts of process-induced charge are shown. While the embodiments shown in FIGS. 9 to 36 are described in accordance with MirrorBit memory devices, the charge dissipation structures depicted can also be used to protect similar gates of transistors and portions of other devices in other types of semiconductor memory cores, such as floating gate Flash EPROMs, standard EPROMs, DRAMs and SRAMs.

Figure 9:
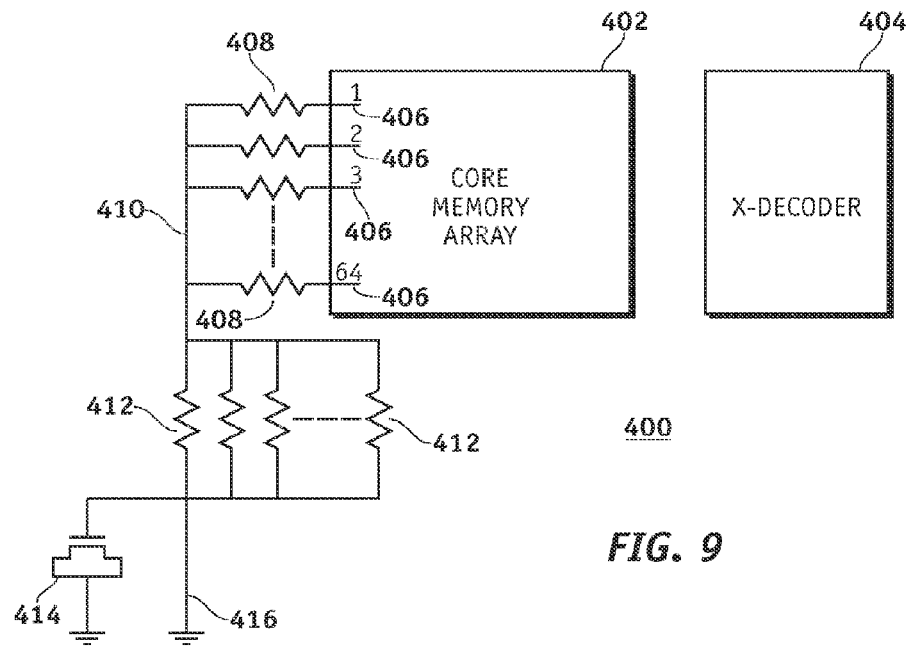
FIG. 9 is a schematic diagram of a charge dissipation protection circuit in accordance with a first memory embodiment of the present invention.
Figure 10:
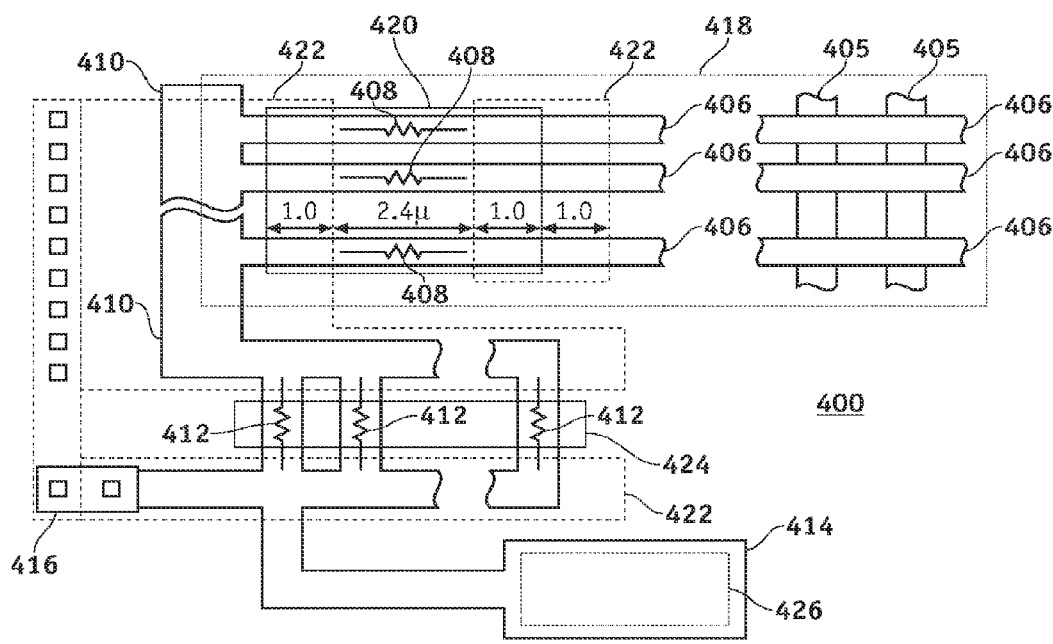
FIG. 10 is a layout view of a charge dissipation protection circuit in accordance with the first memory embodiment of the present invention.

FIGS. 9 and 10 depict a schematic diagram and a layout diagram, respectively, of a memory device 400 in accordance with a first memory embodiment of the present invention including a core memory array 402 and an X-decoder 404 for controlling voltages applied to word lines 406. The word lines 406 that form the gates of MirrorBit core transistors must be very well protected from accumulating process-induced charge. Also, maintaining fine gradations in the threshold voltage levels of MirrorBit core transistors is critical to the proper functioning of MirrorBit semiconductor memory devices 400. In addition, semiconductor memory device 400 yields and reliability can be seriously compromised if core transistor gate dielectrics are charged or damaged by process-induced charging.

Referring to FIG. 9, the memory array 402 includes sixty-four word lines 406, each of the word lines connected to its own high impedance polysilicon resistor 408. The sixty-four word lines 406 make up a sector of the memory array 402. A sector is defined as the smallest portion of a memory array that will be erased at one time. A memory array contains one or more sectors. While the array 402 shown in FIG. 9 contains only one sector, and that sector includes sixty-four word lines, those skilled in the art will understand that memory arrays come in many sizes with sectors including memory cells connected to either more than or less than sixty-four word lines 406. When a memory sector is erased, all of the word lines 406 in that sector are driven to a common negative voltage.

In MirrorBit memory devices 400, negative voltages are applied to the word lines 406 during erase operations and positive voltages are applied to the word lines 406 during programming and read operations. The charge dissipation protection structures in accordance with the first memory embodiment of the present invention provides protection of the word lines 406 from in-process charging while enabling the memory device 400 to function correctly during normal product operation by acting largely as open circuits during erase, programming and read operations (i.e., in the presence of positive and negative voltage polarities across the protection structures). This is because protection structures in accordance with the first memory embodiment of the present invention use high impedance polysilicon thin film resistors 408 in series with each of the word lines 406. Thus, the resistors 408 are designed to have resistor impedances such that the resistors have high enough resistor impedances to act primarily as open circuits during normal product operation while having low enough resistor impedances to act as conductors of process-induced charge during processing.

The high impedance resistors 408 are made in portions of the polysilicon that have had the normal metal-silicide deposition and reaction blocked therefrom (i.e., gaps in the metal-silicide are formed over the polysilicon in the resistors 408). The resistors 408 are either undoped or lightly doped. The resistors 408 are connected between the word lines 406 and a polysilicon spine 410. In accordance with this embodiment, the spine 410 is made from a portion of the polysilicon layer that is doped and which has metal-silicide formed thereon, thereby providing a low impedance spine 410. In accordance with this embodiment, there are one or two polysilicon spines 410 for each memory sector. With hundreds of word lines in each sector and often with multiple sectors in each memory array, hundreds of word line resistors 408 could be connected to a single spine 410.

The polysilicon spine 410 is connected to one or more undoped or lightly doped high impedance polysilicon grounding resistors 412 to enable the word lines 406 to attain relatively high voltages during programming and erase operations by isolating the high voltages in the polysilicon to the word lines 406 therein. Thus, while commonly connected to the spine 410, the impedances of the resistors 408 is large enough to virtually isolate each word line 406 from the rest of the word lines 406 during the read and programming phases of normal product operation. During erase, when all of the word lines 406 in a sector are simultaneously driven negative in voltage, the spine 410 may also be drawn to a negative voltage by leakage currents from the word lines 406 through the resistors 408. The grounding resistors 412 prevent the negative going spine 410 from directly shorting to ground. By not shorting the spine 410 directly to ground, current leakages from the word lines 406 are reduced.

When there is more than one grounding resistor 412 connected to the spine 410, the grounding resistors 412 are connected in series or in parallel with one another to facilitate the tuning of the overall value of the grounding resistor set. A first set of terminals of the grounding resistors 412 is connected to the spine 410. The other terminals of the grounding resistors 412 are connected to a polysilicon terminal of a gate oxide charge passage device 414. The gate oxide charge passage device 414 is a relatively thin dielectric polysilicon to substrate capacitor or polysilicon to doped well capacitor. In this embodiment, the dielectric in the capacitor 414 is significantly thinner than the gate dielectrics of the MirrorBit core transistors being protected. The thin gate oxide allows the passage of process-induced charge that has accumulated on the memory word lines 406 through the charge passage device 414. Charge can pass through the charge passage device's thin oxide via carrier tunneling or through oxide breakdown. During programming and erase operations, the grounding resistors 412 prevent the high voltages that are placed on the word lines 406 from reaching the charge passage device 414.

The charge passage device 414 is adequate for protecting the polysilicon word lines 406 forming the gates of the MirrorBit core transistors from the damaging levels of charge that would otherwise accumulate thereon due to process-induced charging during polysilicon etching. For enhanced protection against process-induced charging, subsequent to the polysilicon processing, a second charge passage device 416 is formed during metal deposition processing by forming a metal connection 416 placed in parallel with the thin dielectric polysilicon to substrate capacitor or polysilicon to doped well capacitor 414. The second charge passage device 416 is a metal connection of deposited metal between metal to polysilicon contacts and metal to source-drain contacts. The polysilicon portion of the charge passage device 416 also connects to the grounding resistors 412.

Referring to FIG. 10, a layout diagram of the charge dissipation structure in a memory device 400 in accordance with the first memory embodiment of the present invention is shown. The memory array 402 (FIG. 9) consists of bit lines 405 coupling the source-drain regions of the MirrorBit core transistors and word lines 406 coupling the gates thereof with a layer of dielectric 418, such as an oxide-nitride-oxide layer 418 formed between the bit lines 405 and the word lines 406 in a manner well-known to those skilled in the art. The word lines 406, the resistors 408, the spine 410, the grounding resistors 412 and part of the charge passage device 414 are formed during deposition of a single layer of polysilicon as shown by the outlined portions of these lines and devices 406, 408, 410, 412, 414.

At the end of the word lines 406, the high impedance resistors 408 are formed by blocking metal silicide formation in a region 420. While the spine 410 and the regions connecting the resistors 408 to the word lines 406 and the spine 410 are donor doped (i.e., doping the poly-silicon with N+ (donor type) dopant) in regions 422, the high impedance resistors 408 are formed in undoped or lightly doped silicide-blocked polysilicon. Likewise, the grounding resistors 412 are formed in undoped or lightly doped silicide-blocked polysilicon regions 424 between and connected to the donor doped regions 422.

In accordance with the first memory embodiment of the present invention, the connection between the high impedance resistors 408 and the word lines 406 includes a donor doped region 422, preferably, of two microns, half of which is silicide-blocked. The high impedance resistors 408 are preferably formed in a 2.4 micron central portion of the undoped or lightly doped silicide-blocked polysilicon region 420 between silicide-blocked portions of the donor doped regions 422 of, preferably, one micron polysilicon widths.

The charge passage device 414 is a thin gate oxide charge leakage device formed from polysilicon over, and connected to, a source-drain region 426 as ground. The thin gate oxide is, preferably, about thirty-nine Angstroms thick, thereby providing a path for charge to leak from the polysilicon layer to ground (i.e., the source-drain region 426) prior to the first metallization step following deposition of the polysilicon layer. During the first metallization step, the polysilicon to metal to source-drain region grounding connection 416 is formed to augment the flow of charge through the charge passage device 414.

All of the polysilicon devices 406, 408, 410, 412, 414 are portions of one or two polygons of polysilicon, wherein each polygon includes word lines 406, individual word line resistors 408, the polysilicon spine 410, grounding resistors 412, and the polysilicon gate portion of the polysilicon to substrate or well capacitor 414. The schematic and layout of FIGS. 9 and 10 depict only one polysilicon spine 410 used in a memory sector. In alternate embodiments, two polysilicon spines 410 may be used for a single memory sector. In such embodiments, half of the word lines 406 in the sector connect through high impedance thin film resistors 408 to one spine 410 and the other half of the word lines 406 connect through high impedance thin film resistors 408 to the other spine 410. Such embodiments include two polygons of polysilicon with each polygon containing half of the word lines 406, half of the individual word line resistors 408, one polysilicon spine 410 and the gate portion of the polysilicon to substrate or well capacitor 412.

Figure 11:
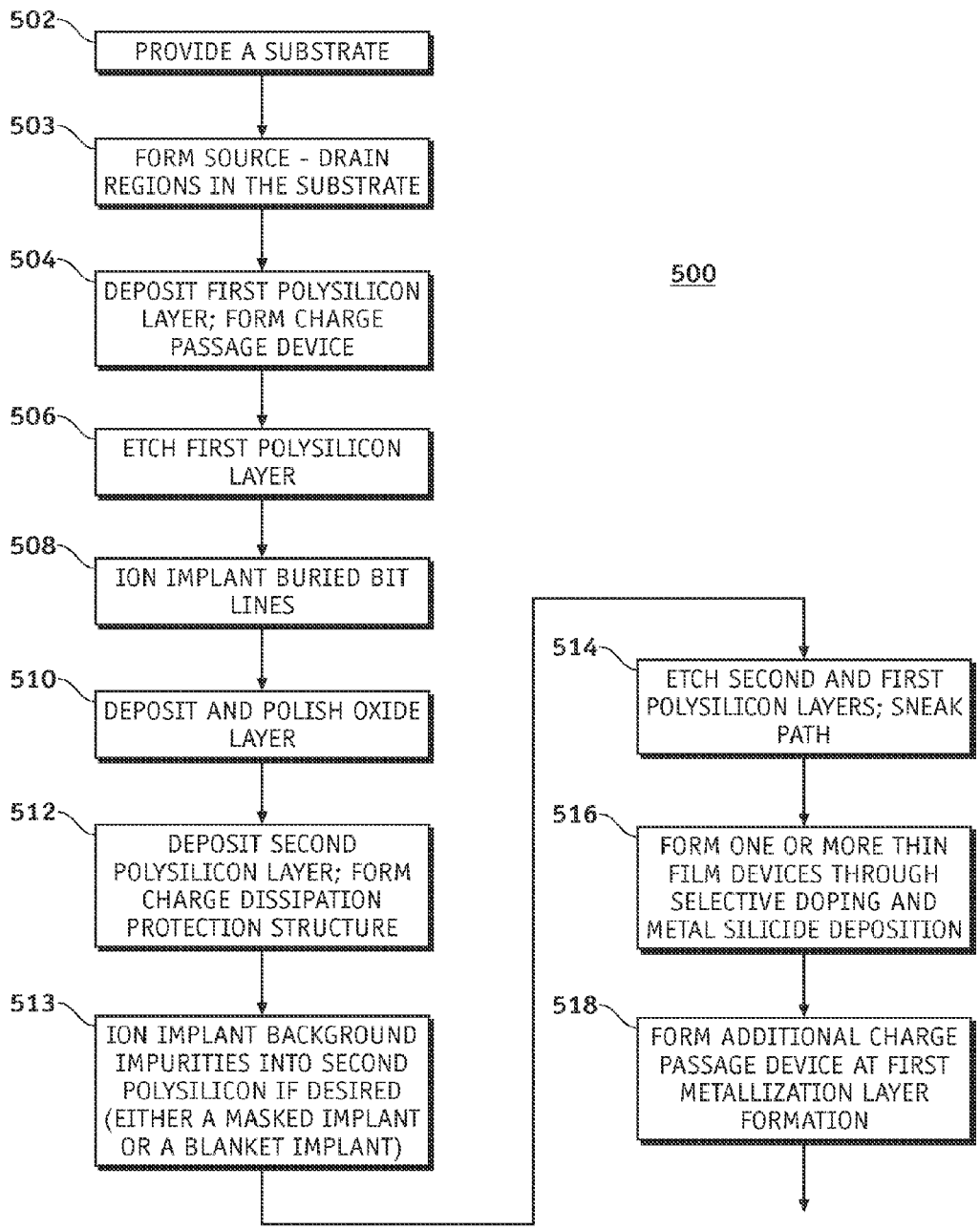
FIG. 11 is a flowchart of a method for forming a semiconductor device in accordance with the first memory embodiment of the present invention.

One embodiment of a method 500 for fabricating the memory device 400 in accordance with the first memory embodiment of the present invention is depicted in FIG. 11. While a number of processing steps are shown in FIG. 11 that pertain to fabrication of the memory 400 in accordance with the first memory embodiment of the present invention, those skilled in the art will realize that these are only a portion of the steps necessary for fabricating the memory device 400 and that additional steps may vary from manufacturer to manufacturer, factory to factory or device to device. The processing steps shown in FIG. 11 and discussed hereinbelow are those steps pertaining to the formation of the charge dissipation protection structure of the memory device 400.

Initially, a substrate is provided 502 for fabricating the memory device 400 thereon. In addition to providing the substrate, step 502 could include doping the substrate to form doped wells therein. Source-drain regions are formed 503 in the substrate. Formation of these source-drain regions creates the bottommost layer of the charge passage device 414 (FIG. 10).

The first polysilicon layer is deposited at step 504. Deposition of this first polysilicon layer forms the topmost layer of the charge passage device 414 (FIG. 10). For example, if the charge passage device 414 is a thin oxide MOS capacitor (i.e., a MOSFET with drain and source connected together) the first polysilicon layer being formed over a source-drain region 426 (FIG. 10) forms a thin gate oxide layer therebetween which acts as the gate electrode of the capacitor 414. Thus, processing step 504 completes formation of the charge passage device 414. The polysilicon of the first polysilicon layer connects the polysilicon semiconductive layer of the device to be protected (i.e., the gate electrodes of the memory core transistors) to the charge passage device 414. A first current path is then formed between the device to be protected and the charge passage device 414. This first current path may be referred to as a "sneak path".

The dielectric beneath the first polysilicon layer in the charge passage device 414 may be the same as or different from the dielectric beneath the first polysilicon layer in the device to be protected. In accordance with the first memory embodiment, the dielectric in the charge passage device 414 is a thirty-nine Angstrom thick silicon dioxide layer while the dielectric in the device to be protected (the core memory transistor) is an oxide nitride oxide layer 418 and is thicker (being composed of stacked layers of silicon dioxide, silicon nitride and silicon dioxide).

At step 506, the first polysilicon layer is etched (i.e., patterned). In the case of the MirrorBit memory device 400, the regions of the first polysilicon layer residing over the memory array's 402 (FIG. 9) buried bit lines 405 (FIG. 10) are etched away. The first polysilicon layer patterning does not etch away or interrupt the first current path through the remaining first polysilicon layer from the device to be protected to the charge passage device 414.

Figure 12:
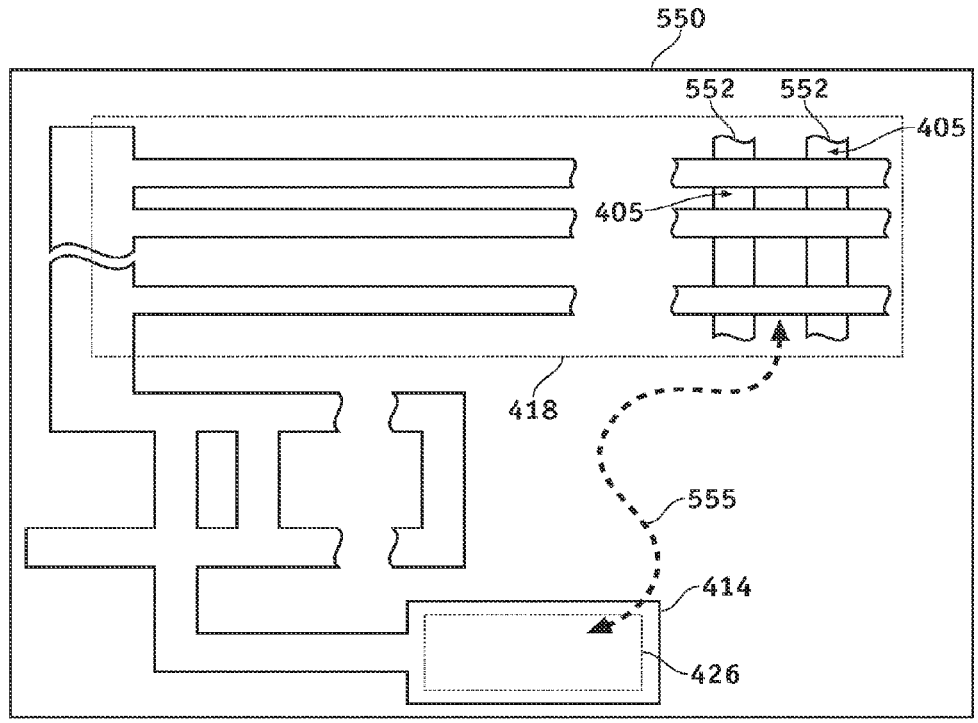
FIG. 12 is a layout view of the charge dissipation circuit after the first polysilicon deposition and etch steps during the method for forming a semiconductor device in accordance with the first memory embodiment of the present invention.

Referring to FIG. 12, the memory device 400 after step 506 is shown. The first polysilicon layer 550 is shown with etched holes 552 over the bit-lines 405. The first current path 555 from the devices to be protected (the gate electrodes of the memory core transistors) to the charge passage device 414 is shown. Also, shown in outline form are the word lines 406, the word line protection resistors 408, the spine 410 and the grounding resistors 412. As the process discussed herein is a two layer polysilicon process, completion of these devices in the charge dissipation protection structure are formed of the first layer of polysilicon and the second layer of polysilicon.

Referring back to FIG. 11, ion implantation at step 508 causes ion implant to pass through the etched holes 552 in the first layer of polysilicon 550 over the buried bit lines 405 to dope the buried bit lines 405. The first layer of polysilicon 550 and the holes 552 therethrough are patterned in such a way as to determine precisely where in the substrate the implant goes. This implant to the buried bit lines 405 is "aligned" to the position of the buried bit lines 405 by the holes 552 in the first layer of polysilicon 550 (e.g., a self-aligned gate process).

After the implantation step 508, the holes in the first layer of polysilicon 550 are filled by deposition 510 of an insulating layer such as an oxide (e.g., silicon dioxide) 418. The oxide or other insulating layer 418 is also deposited 510 over other portions of the first layer of polysilicon 550. Thereafter, the oxide or insulating layer is polished away 510 leaving oxide or insulator only in the holes in the first layer of polysilicon 550 over the bit lines 405. The deposition and polishing of the oxide layer at step 510 does not affect the first current path 555 through the remaining first layer of polysilicon 550 between the device to be protected and the charge passage device 414.

The second polysilicon layer is deposited at step 512 and contacts all of the first polysilicon layer that remains after the first polysilicon layer etch step 506. The underside of the second polysilicon layer contacts the top side of the first polysilicon layer. The second polysilicon layer over the charge passage device 414 and over the device to be protected is connected in this way to the first polysilicon layer over both devices. The second polysilicon layer forms a second conducting path between the polysilicon semiconductive layer of the devices to be protected (i.e., the word lines 406 that form the gate electrodes of the memory core transistors) and the polysilicon semiconductive layer of the charge passage device 414. This second current path is electrically in parallel with the first current path 555 and forms the charge dissipation protection structure by passing through the portions of the polysilicon corresponding to the word lines 406, the word line protection thin film devices 408, the spine 410, the grounding resistors 412 and the charge passage device 414. A portion of the second current path in the second polysilicon layer is utilized to create the one or more thin film devices 408.

At step 513, background impurities can be ion implanted into the second polysilicon if desired. These impurities can be selectively added to portions of the second polysilicon by using one or more masks to block implantation to portions of the second polysilicon. Alternatively, the full layer of second polysilicon can be implanted in a blanket fashion by omitting a blocking mask. Differing impurity concentrations can be implanted into different portions of the second polysilicon layer if one or more blocking masks are used and two or more implant steps are employed. For example, a blanket implant can be made to the full second polysilicon layer and then a blocking mask can be used to pattern a blocking layer to block a second implant from portions of the second poly silicon layer. In this way, some portions of the second polysilicon layer will be doped by both implants (blanket implant and second implant) while others will only be doped by the blanket implant. If desired, these implants can be used to optimize the impedances of the high impedance portions of the various thin film resistors and diodes shown in the various memory embodiments depicted in FIGS. 9 through 36 (408, 412, 622, etc.). Otherwise these implant steps can be skipped and the polysilicon's impedance will be left in its as-deposited state (typically a high impedance state).

At step 514, the second polysilicon layer and the underlying first polysilicon layer are etched. The second current path is active during this etch step and continues to exist and to be active after the etch step and through subsequent processing steps. The etch step severs the first current path 555 (i.e., removes the sneak path).

After etching the second polysilicon layer and the underlying first polysilicon layer 514, one or more thin film devices 408 are formed 516. The thin film devices 408 are formed in portions of the second polysilicon layer that constitute the second current path. In addition, the second current path is modified by the deposition of metal silicide on portions of the second polysilicon layer that forms the path. Portions of the second polysilicon layer in the path are also ion implanted.

Each of the one or more thin film devices 408 is formed 516 within a portion of the second polysilicon layer by implants to the portion of the second polysilicon layer and by blocking the formation of metal silicide over the portion of the second polysilicon layer. In accordance with the first memory embodiment of the present invention, the thin film devices 408 are formed in a portion of a second polysilicon layer line by blocking metal silicide from forming over a portion of the line and then applying ion implants to the ends of the portion of the line that are void of silicide. In this manner, high impedance devices such as the high impedance resistors 408 are formed. Thin film devices having various impedances may also be formed by employing various implant and silicide block configurations.

With the formation of the one or more thin film devices 408 in the second current path, the second current path takes on the resistance of the thin film device(s) 408 in addition to any other resistances in the path. These other resistances are small in value relative to the resistance of the high impedance thin film device(s) 408. The thin film device(s) 408 are formed in the polysilicon that resides between the device or devices to be protected on the word lines 406 and the charge passage devices 414.

A self aligned thin film device 408 may be formed when the silicon nitride placed on a portion of the second polysilicon layer to block formation (i.e., deposition and formation) of silicide on that portion of the second polysilicon layer is also used to block ion implantation to that portion of the second polysilicon layer. Utilizing the silicon nitride or other silicide blocking agent in this manner causes the gap in the ion-implanted portions of the second polysilicon layer to be self aligned to the gap in the silicide.

The step 516 can also be used to place more than one thin film device in series in the second current path (e.g., the word line protection resistors 408 and the grounding resistors 412). Further, numerous current paths similar to the above-described second current path can be combined to form networks of such current paths. Thus, in accordance with the method 500 for formation of the memory device 400 in accordance with the first memory embodiment of the present invention, the combination of the first and second current paths protects the devices to be protected during deposition of the first polysilicon layer and all subsequent processing steps.

After the polysilicon related processing is completed, connections are formed at step 518 through contacts to the polysilicon, first layer of metal and contacts to grounded source-drain regions to create the poly grounding connection 416. This current path 416 exists after formation of the first metallization layer 518 and through all subsequent processing.

Figure 13:
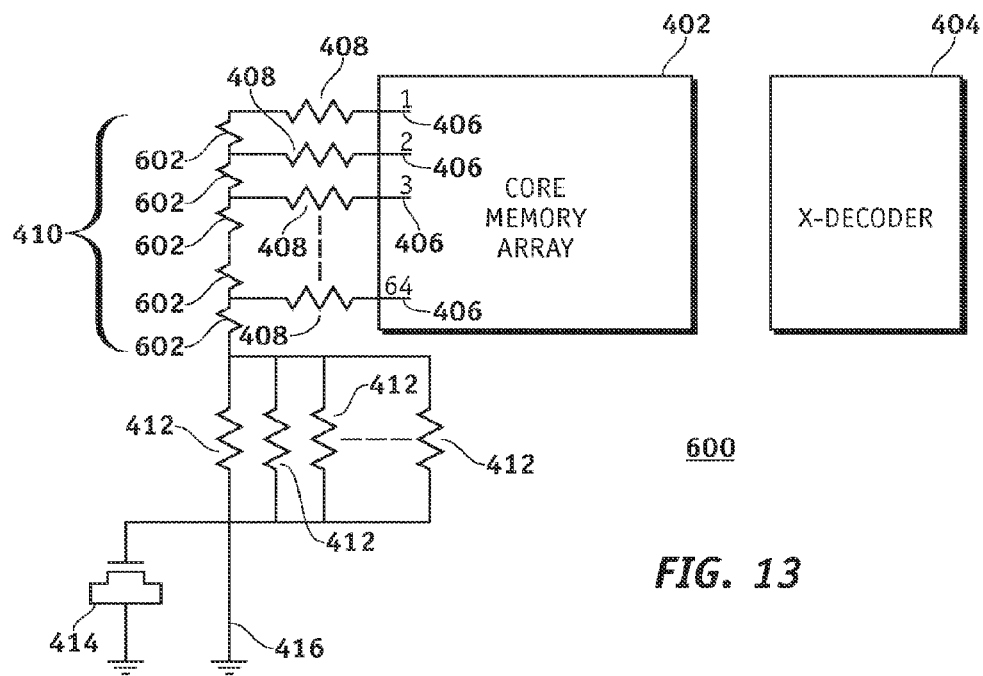
FIG. 13 is a schematic diagram of a charge dissipation protection circuit in accordance with a second memory embodiment of the present invention.
Figure 14:
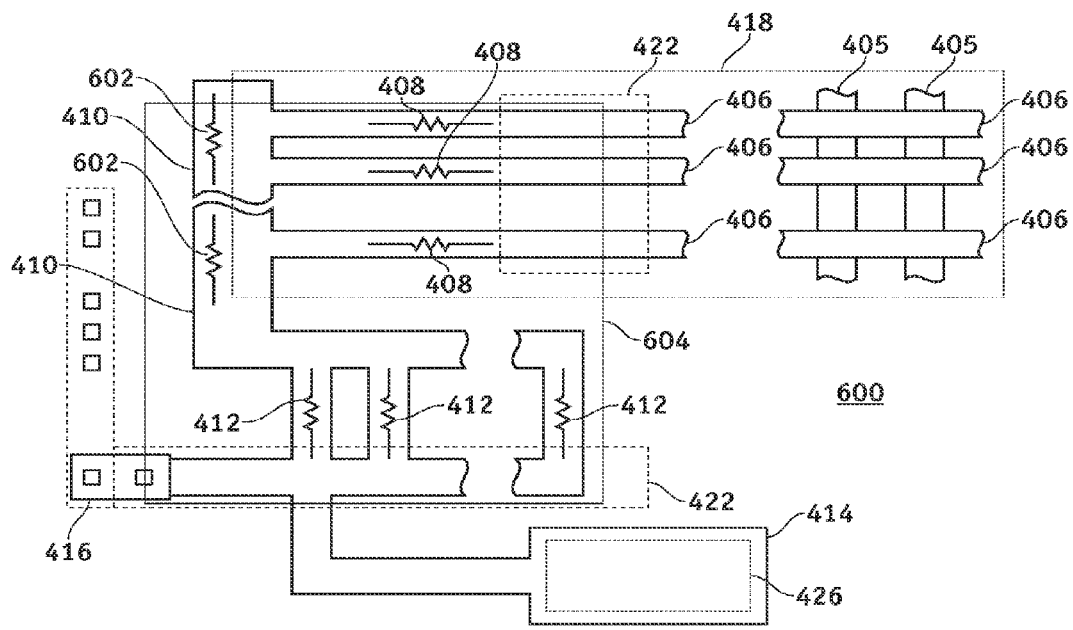
FIG. 14 is a layout view of a charge dissipation protection circuit in accordance with the second memory embodiment of the present invention.

Referring to FIGS. 13 and 14, a schematic diagram and a layout view of a memory device 600 in accordance with a second memory embodiment of the present invention are shown. The memory device 600 is similar to the memory device 400 (FIGS. 9 and 10) except that the spine 410 does not have metal-silicide formed over it and is not doped. In accordance with the present invention, the spine 410 can be of low or high impedance and, depending upon the requirements of a particular application for conductivity or resistivity in the spine 410, the spine 410 can be fabricated with or without metal-silicide and with or without doping.

Referring to FIG. 13, the spine 410 is made of high impedance material and, in essence, includes high impedance resistors 602 which merge with the high impedance resistors 408 connected to the word lines 406. Referring to FIG. 14, the gaps in the metal-silicide over the individual high-impedance word line resistors 408 is extended over the spine 410 and the mask polygon 604 that is used to prevent the doping of the individual high-impedance word line resistors 408 is also extended to prevent doping in the spine 410, thereby merging the spine 410 and the individual high-impedance word line resistors 408 into a single large multiple connection high-impedance resistor structure including high impedance resistors 602. In this manner, the spine 410 is formed without doping and without metal-silicide resulting in high impedance resistors 602, thereby using less layout space in the memory device 600 for the spine 410 and the charge dissipation protection structure. The memory device 600 in accordance with this second memory embodiment conserves layout space while providing a multiple connection structure that adequately connects the individual word lines 406 to the grounding resistors 412 and through them to the polysilicon terminal of the thin dielectric polysilicon to substrate capacitor 414.

Figure 15:
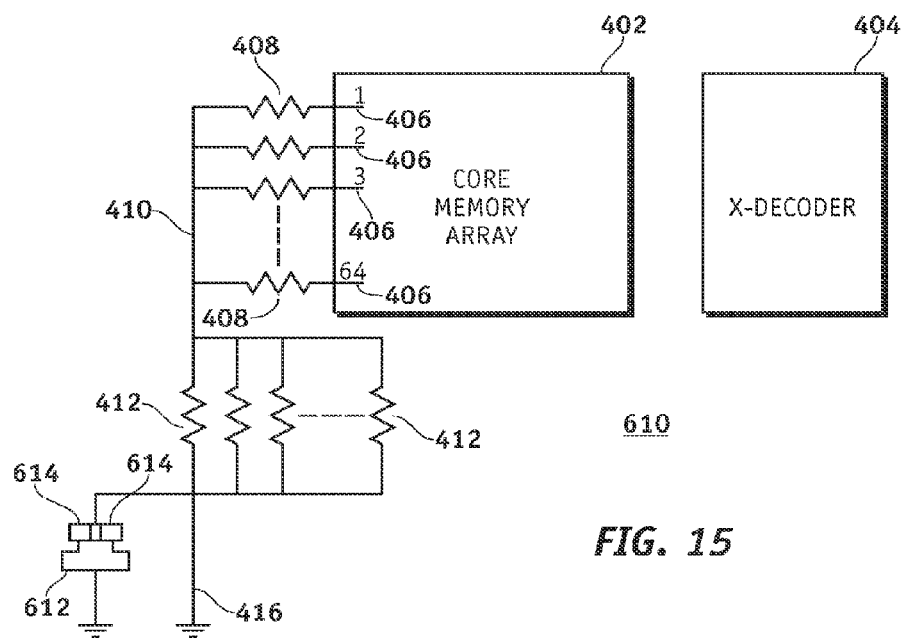
FIG. 15 is a schematic diagram of a charge dissipation protection circuit in accordance with a third memory embodiment of the present invention.
Figure 16:
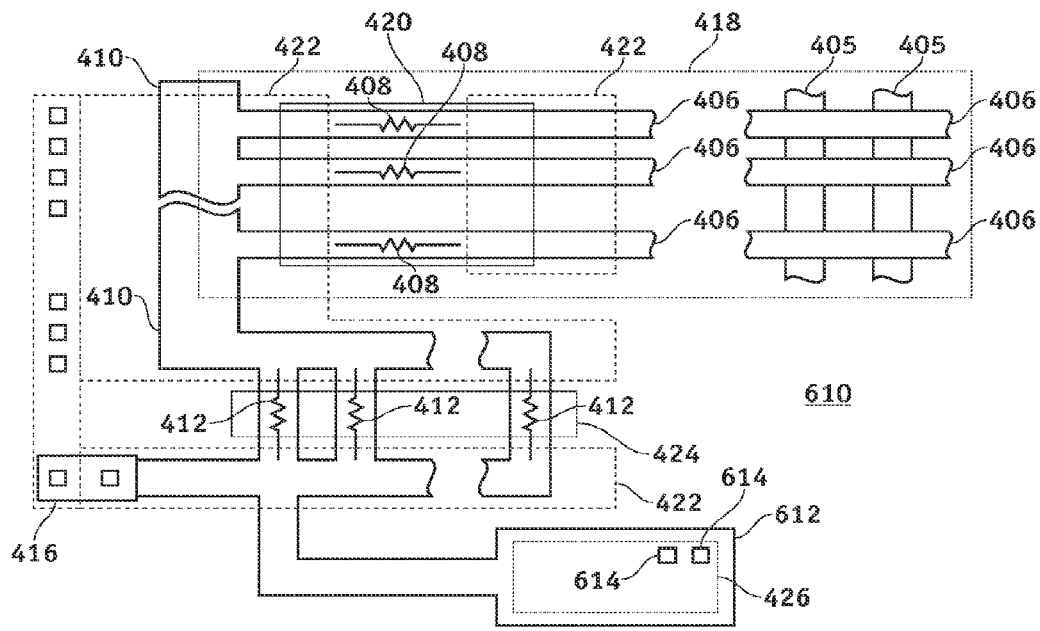
FIG. 16 is a layout view of a charge dissipation protection circuit in accordance with the third memory embodiment of the present invention.

Referring to FIGS. 15 and 16, a schematic diagram and a layout view, respectively, of a memory device 610 in accordance with a third memory embodiment of the present invention are shown. The memory device 610 is similar to the memory device 400 (FIGS. 9 and 10) except that the thin dielectric polysilicon to substrate or polysilicon to doped well capacitor 414 is replaced with polysilicon to source-drain region 426 (FIG. 16) buried contacts 612. Buried contacts 612 are contacts 614 (FIG. 16) that extend directly from the polysilicon layer to the underlying source-drain region 426 (FIG. 16) without having to connect through a subsequently formed metal layer. Like the thin dielectric polysilicon to substrate or polysilicon to doped well capacitor charge passage device 414 (FIG. 10), a charge passage device 612 using buried contacts 614 has the advantage of already existing in the memory device 610 as soon as the polysilicon layer deposition begins, thereby providing a charge passage device 612 for dissipating charge during polysilicon processing. As described above, the grounding resistors 412 also serve the purpose of preventing high voltages that are placed on the word lines 406 during programming and erase operations from reaching the buried contact charge passage device 612.

Figure 17:
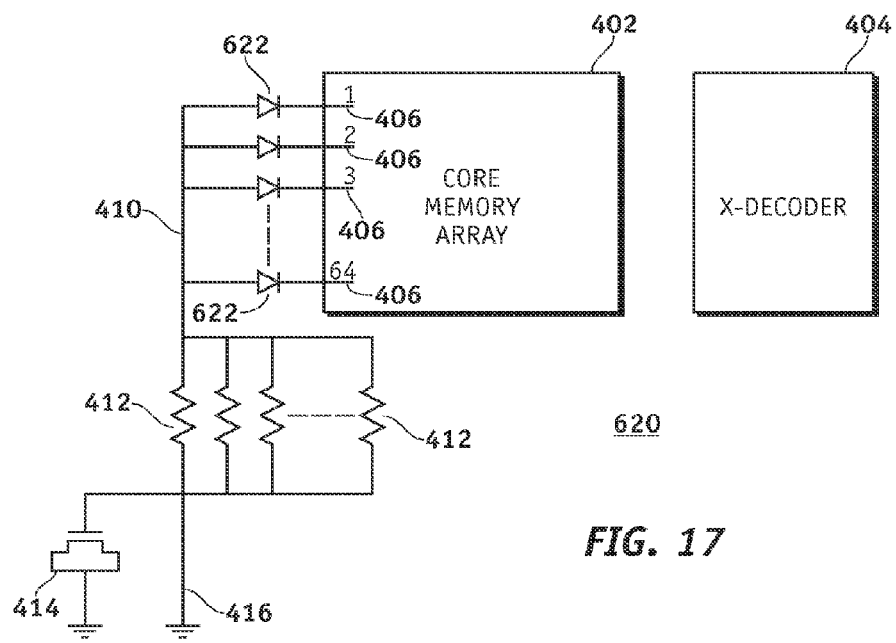
FIG. 17 is a schematic diagram of a charge dissipation protection circuit in accordance with a fourth memory embodiment of the present invention.
Figure 18:
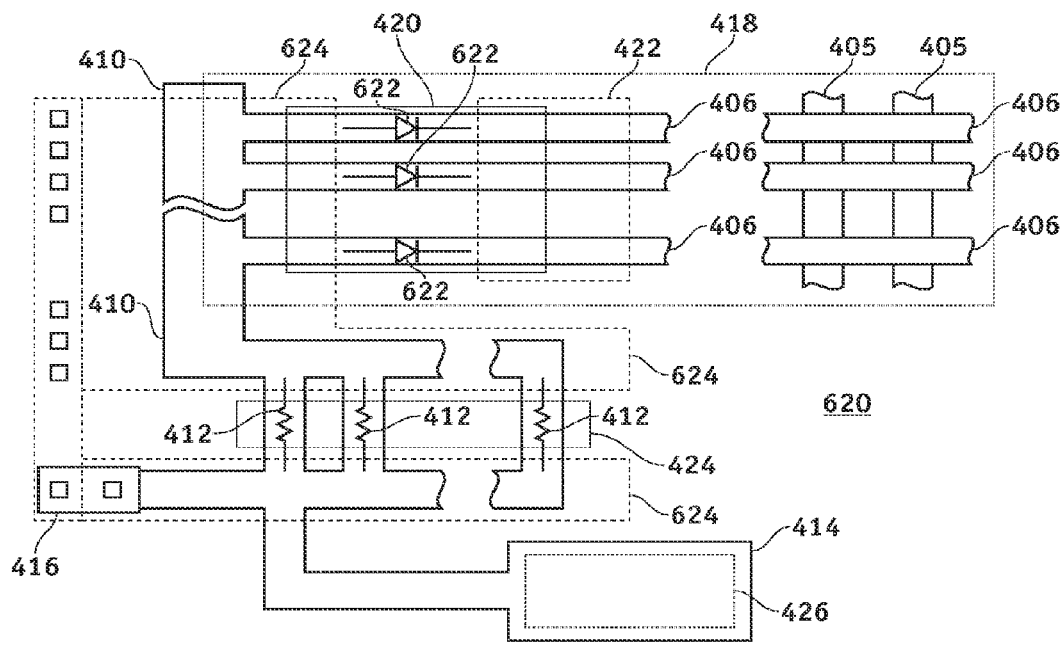
FIG. 18 is a layout view of a charge dissipation protection circuit in accordance with the fourth memory embodiment of the present invention.

Referring to FIGS. 17 and 18, a schematic diagram and a layout view, respectively, of a memory device 620 in accordance with a fourth memory embodiment of the present invention are shown. The memory device 620 is similar to the memory device 400 (FIGS. 9 and 10) except that the high impedance word line resistors 408 are replaced with high impedance polysilicon PIN diodes 622. Like the resistors 408 that they replace, these PIN diodes 622 are formed in a portion of polysilicon that has not had metal-silicide formed on it. The high impedance PIN diodes 622 are formed by doping one end of a portion of the polysilicon layer with P+ (acceptor type) dopant 624 and the other end of the portion with N+ (donor type) dopant 422 while leaving the middle of the portion between the doped regions without dopant to form the high impedance, nearly insulating portion of the PIN diodes 622. The PIN diodes 622 act as nearly open circuits when one polarity of voltage is applied and conduct current similar to the high impedance resistors 408 (FIG. 10) when the opposite polarity of voltage is applied.

Alternatively, low impedance diodes 622 can be provided. Low impedance diodes 622 are formed by doping the middle of the PIN diodes 622 with either N or P type dopant. The low impedance diodes 622 act as high impedances when one voltage polarity is applied and readily conduct in the presence of the opposite voltage polarity. Whether the diodes 622 provided are high impedance PIN diodes or low impedance diodes, the diodes 622 are oriented in such a fashion as to aid in the dissipation of harmful process-induced charge while not hindering the normal functioning of the product circuitry.

More particularly, with the N+ and P+ regions of the PIN diodes 622 oriented in accordance with this fourth memory embodiment of the present invention as shown in FIGS. 17 and 18, the diodes 622 act as nearly open circuits during normal read and programming operations (with positive voltages applied to word lines 406) and act as high impedance forward biased diodes 622 during erase operations (negative voltages applied to the word lines 406). As described above, during sector erase when all or some of the word lines 406 in a sector are simultaneously driven negative in voltage, the spine 410 is also drawn to a negative voltage by currents from the negatively biased word lines 406 and through the forward biased word line PIN diodes 622. The grounding resistors 412 prevent the negative going spine 410 from directly shorting to ground.

Device characteristics for the memory device 620 can be optimized by appropriately choosing the lengths and widths of the undoped or low-doped silicide-blocked portions 420, 424 of the polysilicon in the devices 622, 412 and by appropriately choosing the doping levels and doping profiles in the various portions 422, 624 of the polysilicon devices 622, 412.

Figure 19:
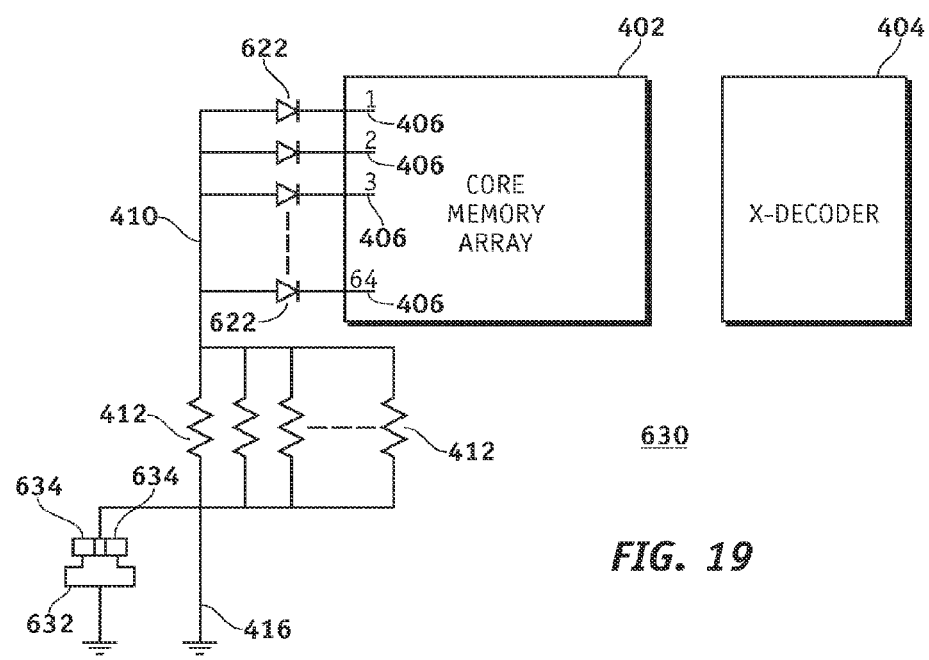
FIG. 19 is a schematic diagram of a charge dissipation protection circuit in accordance with a fifth memory embodiment of the present invention.
Figure 20:
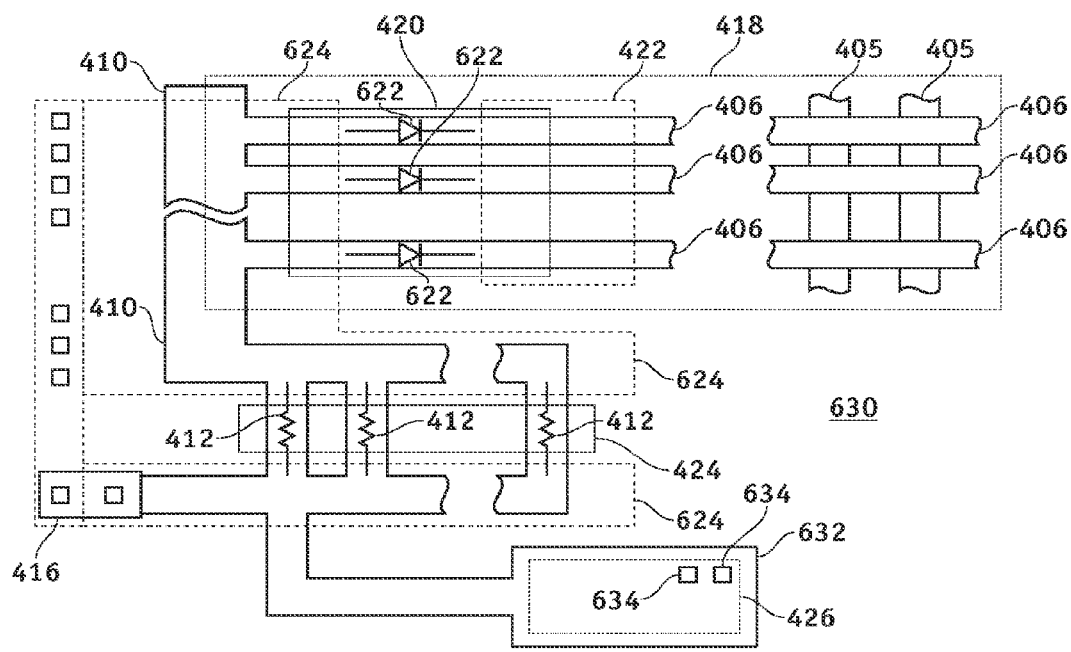
FIG. 20 is a layout view of a charge dissipation protection circuit in accordance with the fifth memory embodiment of the present invention.

Referring to FIGS. 19 and 20, a schematic diagram and a layout view, respectively, of a memory device 630 in accordance with a fifth memory embodiment of the present invention are shown. The memory device 630 is similar to the memory device 620 (FIGS. 17 and 18) except that the thin dielectric polysilicon to substrate or polysilicon to doped well capacitor 414 is replaced with a polysilicon to source-drain region 426 buried contact charge passage device 632. Like the thin dielectric polysilicon to substrate or polysilicon to doped well capacitor charge passage device 414 (FIG. 16), a charge passage device 632 using buried contacts 634 has the advantage of already existing in the memory device 630 as soon as the polysilicon layer deposition begins, thereby providing a charge passage device 632 for dissipating charge during polysilicon processing. As described above, the grounding resistors 412 also serve the purpose of preventing high voltages that are placed on the word lines 406 during programming and erase operations from reaching the buried contact charge passage device 632.

Figure 21:
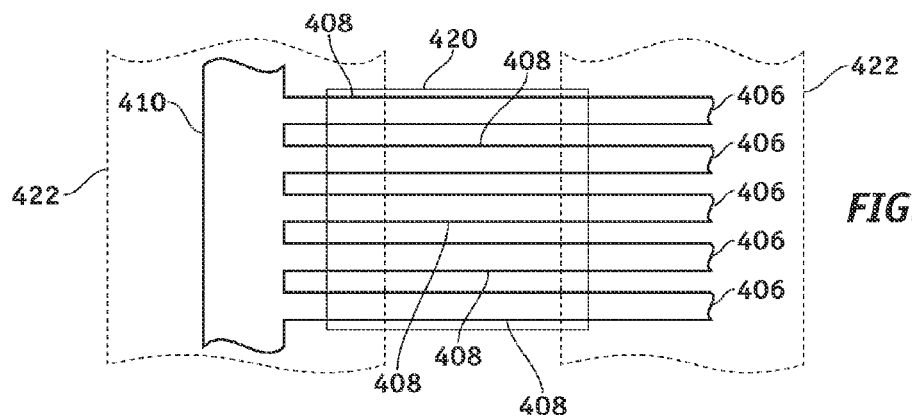
FIG. 21 is a diagram of high impedance resistors in accordance with embodiments of the present invention.

Referring to FIG. 21, a layout diagram of an embodiment of the high impedance undoped or lightly doped polysilicon resistors 408 is shown. The word lines 406 are connected to the individual, word line protection, high impedance resistors 408. The spine 410 ties the ends of the resistors 408 together and leads to devices which provide charge leakage paths to the substrate. The resistors 408 are silicide blocked by masking 420 and either side of the resistors is doped by core polysilicon doping or other N-type doping in regions 422.

Figure 22:
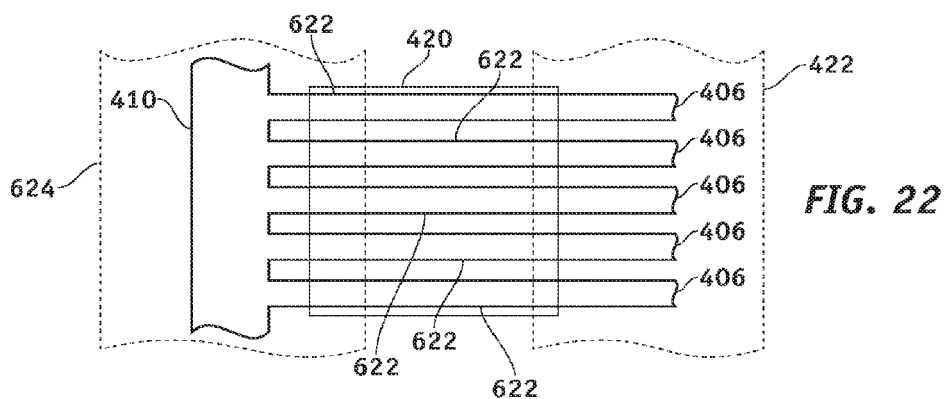
FIG. 22 is a diagram of high impedance PIN diodes in accordance with embodiments of the present invention.

Referring next to FIG. 22, a layout diagram of an embodiment of the high impedance P+/Insulator/N+ (PIN) polysilicon diodes 622 is shown. The word lines 406 are connected to the individual, word line protection, high impedance diodes 622. The spine 410 ties the P+ ends of the PIN diodes 622 together and leads to devices which provide charge leakage paths to the substrate. The PIN diodes 622 are silicide blocked by masking 420 and the sides of the PIN diodes connected to the word lines 406 are doped by core polysilicon doping or other N-type doping in the region 422 while the sides of the PIN diodes connected to the spine 410 are doped by P-type doping in the region 624.

As with the charge dissipation protection structures described in accordance with the memory embodiments above and shown in FIGS. 9, 10 and 13 to 20, the memory embodiments described in FIGS. 23 to 36 include charge dissipation structures suitable for protecting MirrorBit memory core transistors from accumulating damaging amounts of process-induced charge. These charge dissipation protection structures are not limited, however, to MirrorBit memory implementations and can also be used to protect similar gates of transistors and portions of other devices in other types of semiconductor memory cores such as floating gate Flash EPROMs, standard EPROMs, DRAMs and SRAMs.

Figure 23:
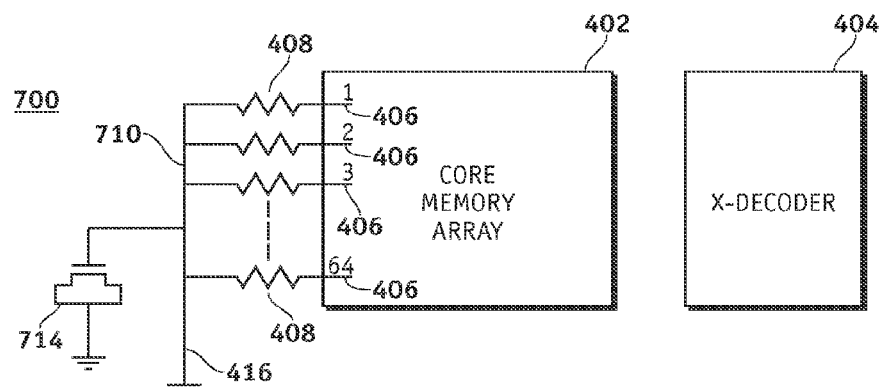
FIG. 23 is a schematic diagram of a charge dissipation protection circuit in accordance with a sixth memory embodiment of the present invention.
Figure 24:
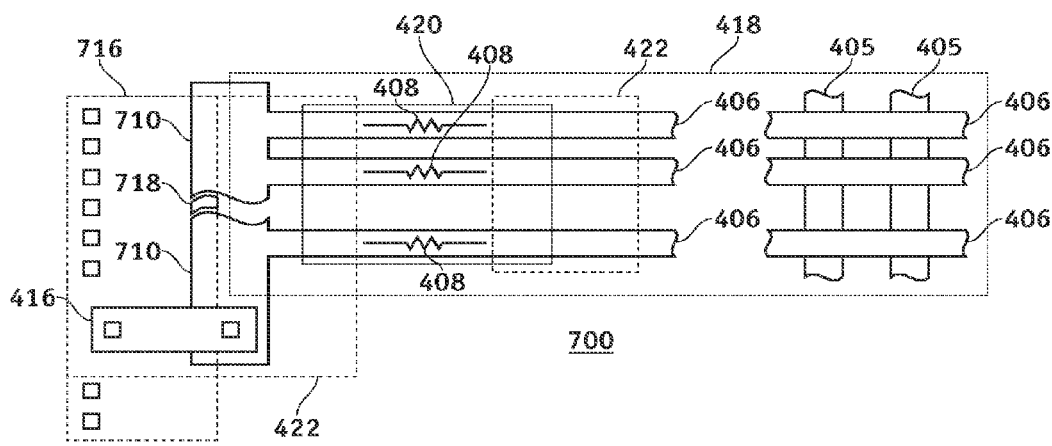
FIG. 24 is a layout view of a charge dissipation protection circuit in accordance with the sixth memory embodiment of the present invention.

Referring to FIGS. 23 and 24, a schematic diagram and a layout view, respectively, of a memory device 700 in accordance with a sixth memory embodiment of the present invention are shown wherein each individual word line 406 is connected to its own high impedance polysilicon resistor 408. The word line protection resistors 408 are made in portions of the polysilicon that has had the normal metal-silicide deposition and reaction blocked by blocking material with a shape defined by masking 420, thereby forming gaps in the metal-silicide over the polysilicon in the high impedance resistors 408. The resistors 408 may be undoped or lightly doped.

One terminal of each high impedance resistor 408 is connected to one of the word lines 406 (each word line being connected to one resistor). The other terminals of the resistors 408 are commonly connected to a piece of polysilicon forming a spine 710. The spine 710 may be of low or high impedance. There are normally one or two polysilicon spines 710 for each memory sector. While the spine 710 of FIG. 23 is connected to sixty-four word line protection resistors 408, a hundred or more word line protection resistors 408 may be connected to a single spine 710.

In accordance with the sixth memory embodiment of the present invention, the polysilicon spine 710 also serves as a portion of the charge passage device 714, i.e., the device 714 that grounds the spine 710 to the substrate or to a doped well. Referring to FIG. 24, the polysilicon spine 710 is formed over the top of a source-drain region 716 residing in the substrate or in a doped well in the substrate.

Often in semiconductor fabrication technologies, the presence of polysilicon over a region of source-drain typically forms a thin gate oxide layer between the polysilicon and the source-drain region. The sixth memory embodiment of the present invention takes advantage of the thin gate oxide formation so that formation of the polysilicon in the spine 710 over the source-drain region 716 as shown in FIG. 24 results in formation of a thin gate oxide 718. The thin gate oxide 718 allows the passage of process-induced charge that has accumulated on the memory word lines 406 by either carrier tunneling or through oxide breakdown. In accordance with this sixth memory embodiment, formation of the polysilicon in the spine 710 over the source-drain region 716 forms a thin gate oxide capacitor charge passage device 714 wherein the charge passage device 714 is incorporated into the spine 710. In this way the spine 710 serves in its previously mentioned role (see spine 410 in FIGS. 9, 10 and 13 through 22) to link the resistors 408 together while also acting as the charge passage device 714. The dielectric in the thin gate oxide capacitor 714 formed from the deposition of the polysilicon over the source-drain region 716 is significantly thinner than the gate dielectrics of the oxide-nitride-oxide layer 418 of the MirrorBit core transistors being protected.

As a result of incorporating charge passage devices 714 into the spines 710, the memory device 700 in accordance with the sixth memory embodiment of the present invention advantageously requires less layout space than the memory device 400 (FIGS. 9 and 10).

While the memory device 700 depicted in FIGS. 23 and 24 includes only one polysilicon spine 710 for the memory sector including word lines 406 one to sixty-four, one or two polysilicon spines 710 could be provided for each memory sector and the memory sector could have more or less than sixty-four word lines 406. All of the polysilicon devices 406, 408, 710 are all portions of only one or two polygons of poly-silicon, each polygon including word lines 406, individual word line resistors 408, and one polysilicon spine 710. When two polysilicon spines 710 are provided for a single memory sector, then half of the word lines 406 in the sector connect through high impedance thin film resistors 408 to one spine 710 and the other half of the word lines 406 connect through high impedance thin film resistors 408 to the other spine 710. Such a structure requires two polygons of polysilicon, each polygon containing half of the word lines 406, half of the individual word line resistors 408 and one polysilicon spins 710.

The spine 710 formed partially in the poly-silicon and the word lines 406 and the word line protection resistors 408 formed in the polysilicon are adequate for protecting the gates of the MirrorBit core transistors from damaging levels of process induced charge. This charge would otherwise accumulate on the core transistor word lines 406 forming the gates due to process-induced charging during polysilicon etching. Added protection against process-induced charging is acquired during the first metallization step with the addition of a connection 416 through metal and contacts from the polysilicon in the spine 710 to the substrate or from the polysilicon in the spine 710 to a doped well residing in the substrate. This added connection 416 protects against charging that can occur in processing subsequent to the first metal layer processing.

In accordance with the sixth memory embodiment of the present invention, the individual high impedance word line resistors 408 each have a low enough impedance to allow adequate passage of charge during processing, thereby preventing damage from process-induced charging. However, the impedance of each of the resistors 408 is large enough to virtually isolate each word line 406 from the rest of the word lines (even though commonly connected through the resistors 408 to the spine 710) during the read, programming and erase phases of normal product operation. Unless prevented during erase when all of the word lines 406 in a sector are simultaneously driven negative in voltage, the polysilicon in spine 710 could also be drawn to a negative voltage by leakage currents from the word lines 406 through the word line resistors 408. Therefore, in accordance with this sixth memory embodiment of the present invention, the resistances of the individual high impedance word line resistors 408 of the memory device 700 are chosen large enough to prevent significant current flow from the word lines 406 to the spine 710.

Figure 25:
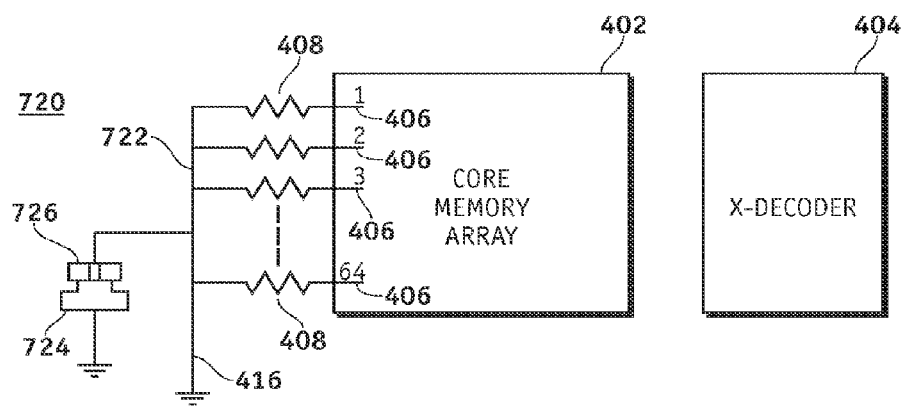
FIG. 25 is a schematic diagram of a charge dissipation protection circuit in accordance with a seventh memory embodiment of the present invention.
Figure 26:
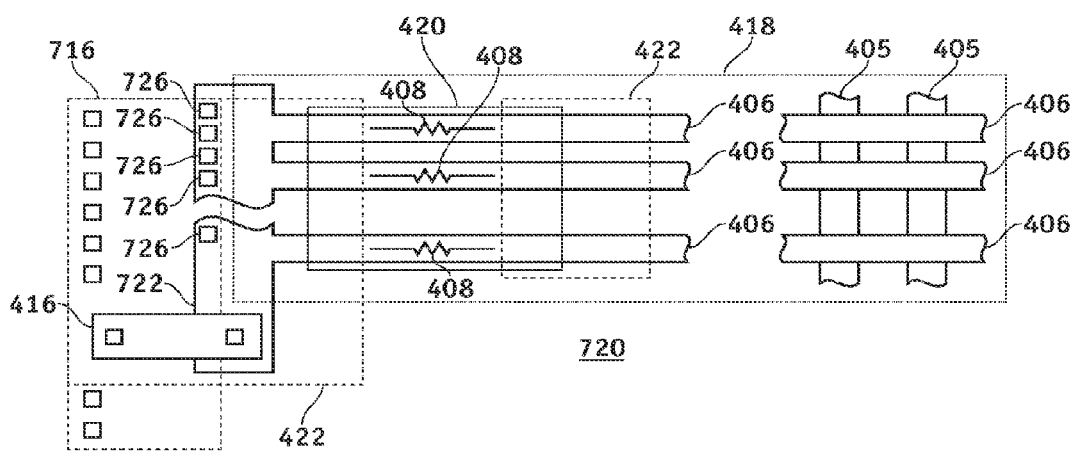
FIG. 26 is a layout view of a charge dissipation protection circuit in accordance with the seventh memory embodiment of the present invention.

Referring to FIGS. 25 and 26, a schematic diagram and a layout view, respectively, of a memory device 720 in accordance with a seventh memory embodiment of the present invention are shown. The memory device 720 is similar to the memory device 700 (FIGS. 23 and 24) except that the charge passage device 724, incorporated into the spine 722, includes, instead of the thin dielectric polysilicon to substrate or polysilicon to doped well capacitor 714, polysilicon to source-drain region 716 buried contacts 726 extending directly from the polysilicon layer to the underlying source-drain region 716 without having to connect through a subsequently formed metal layer. Like the thin dielectric polysilicon to substrate or polysilicon to doped well capacitor charge passage device 714 (FIG. 23), a charge passage device 724 made of buried contacts 726 has the advantage of already existing in the memory device 720 as soon as the polysilicon layer deposition begins, thereby providing a charge passage device 724 for dissipating charge during polysilicon processing. In addition, layout space is conserved by the spine 722 incorporating the charge passage device 724.

Figure 27:
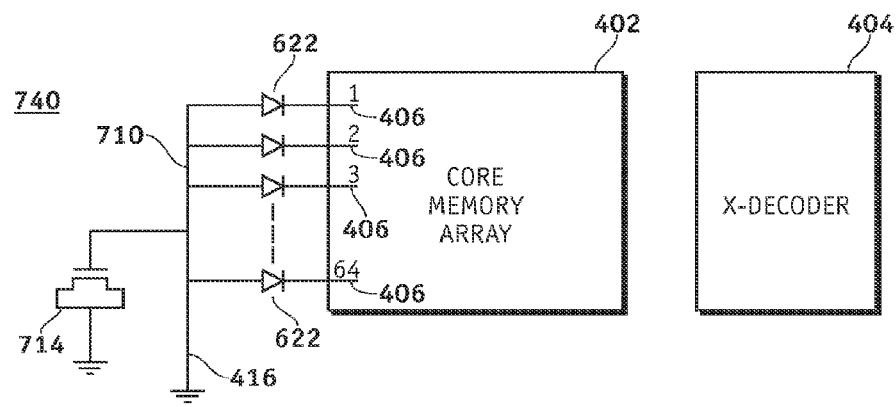
FIG. 27 is a schematic diagram of a charge dissipation protection circuit in accordance with an eighth memory embodiment of the present invention.
Figure 28:
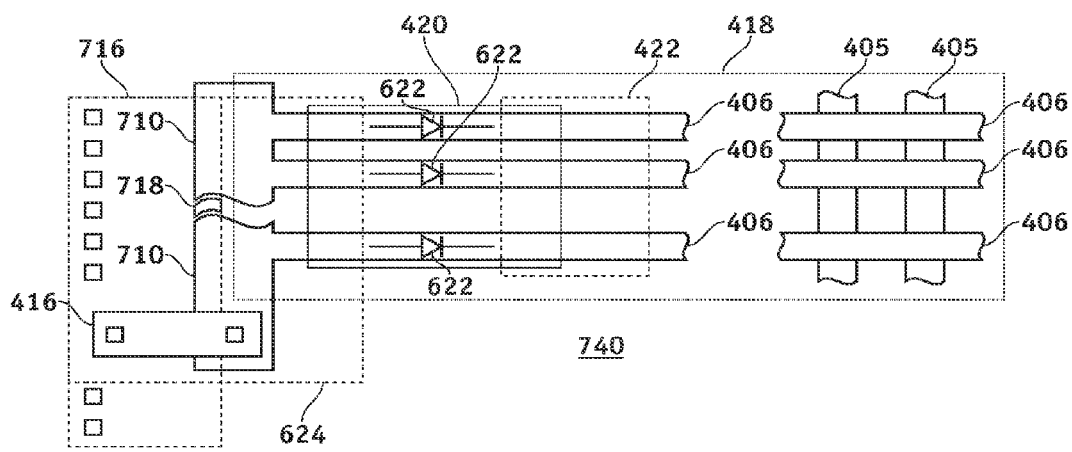
FIG. 28 is a layout view of a charge dissipation protection circuit in accordance with the eighth memory embodiment of the present invention.

Referring to FIGS. 27 and 28, a schematic diagram and a layout view, respectively, of a memory device 740 in accordance with an eighth memory embodiment of the present invention are shown. The memory device 740 is similar to the memory device 700 (FIGS. 23 and 24) except that the high impedance word line resistors 408 are replaced with high impedance PIN diodes 622. Like the resistors 408 that they replace, these PIN diodes 622 are formed in a portion of polysilicon that has not had metal-silicide formed on it. As described above, the high impedance PIN diodes 622 are formed by doping one end of a portion of the polysilicon layer with P+ (acceptor type) dopant 624 and the other end of the portion with N+ (donor type) dopant 422 while leaving the middle of the portion between the doped regions without dopant to form the high impedance, nearly insulating portion of the PIN diodes 622. The PIN diodes 622 act as nearly open circuits when one polarity of voltage is applied and conduct current similar to the high impedance resistors 408 (FIG. 24) when the opposite polarity of voltage is applied.

More particularly, with the N+ and P+ regions of the PIN diodes 622 oriented in accordance with this eighth memory embodiment of the present invention as shown in FIGS. 27 and 28, the diodes 622 act as nearly open circuits during normal read and programming operations (with positive voltages applied to word lines 406) and act as high impedance forward biased diodes 622 during erase operations (negative voltages applied to the word lines 406). While the PIN diodes 622 act as high impedance diodes in accordance with this eighth memory embodiment of the present invention, device characteristics for the memory device 740 can nevertheless be optimized by appropriately choosing the lengths and widths of the undoped or low-doped silicide-blocked portions 420 of the polysilicon in the PIN diodes 622 and by appropriately choosing the doping levels and doping profiles in the various portions 422, 624 of the PIN diodes 622. Diode impedances can be chosen low enough so that both voltage polarities of the PIN diodes 622 can effectively pass process induced charges during processing. However, as with the impedances of the resistors 408 in FIGS. 23 and 24, the forward and reverse impedances of each PIN diode 622 are also large enough to virtually isolate each word line 406 from the rest of the word lines (even though commonly connected through the PIN diodes 622 to the spine 710) during the read, programming and erase phases of normal product operation. Unless prevented during erase when all of the word lines 406 in a sector are simultaneously driven negative in voltage, the polysilicon in spine 710 could also be drawn to a negative voltage by leakage currents from the word lines 406 through the word line PIN diodes 622. Therefore, in accordance with this eighth memory embodiment of the present invention, the impedances of the individual high impedance word line PIN diodes 622 of the memory device 740 are chosen large enough to prevent significant current flow from the word lines 406 to the spine 710.

Figure 29:
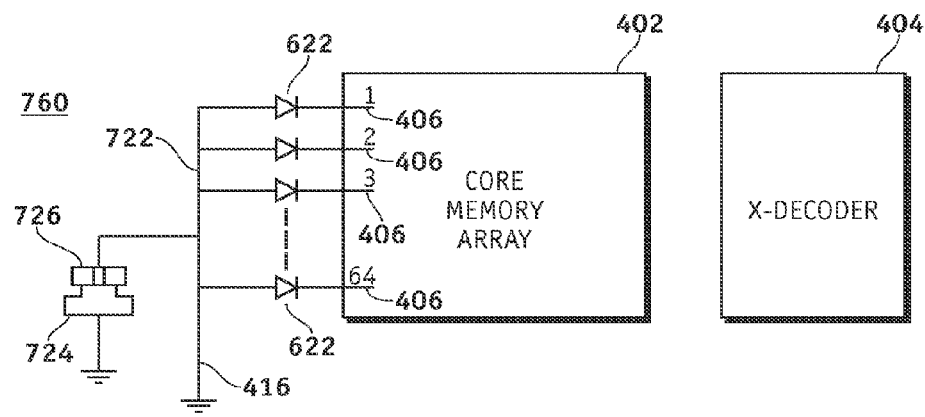
FIG. 29 is a schematic diagram of a charge dissipation protection circuit in accordance with a ninth memory embodiment of the present invention.
Figure 30:
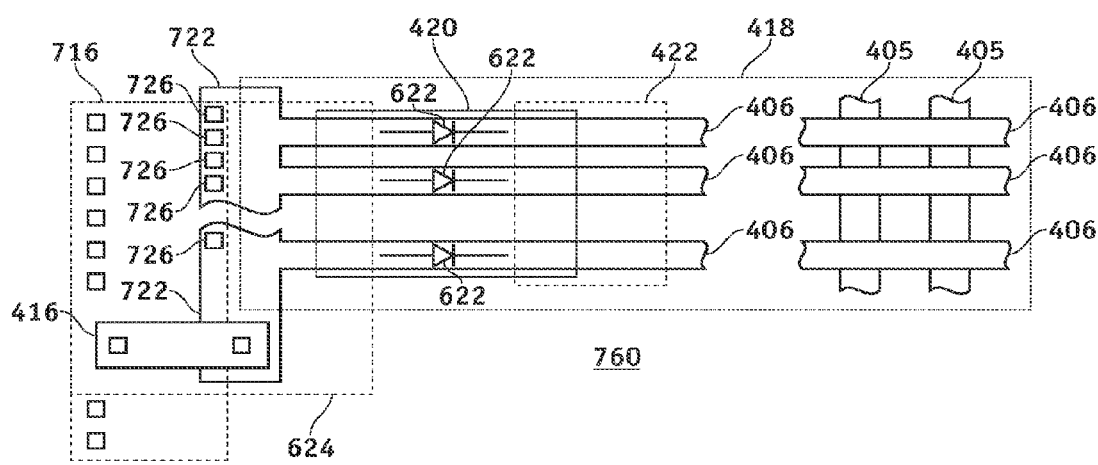
FIG. 30 is a layout view of a charge dissipation protection circuit in accordance with the ninth memory embodiment of the present invention.

Referring to FIGS. 29 and 30, a schematic diagram and a layout view, respectively, of a memory device 760 in accordance with a ninth memory embodiment of the present invention are shown. The memory device 760 is similar to the memory device 740 (FIGS. 27 and 28) except that the charge passage device 724, incorporated into the spine 722, includes, instead of the thin dielectric polysilicon to substrate or polysilicon to doped well capacitor 714, polysilicon to source-drain region 716 buried contacts 726 extending directly from the polysilicon layer to the underlying source-drain region 716 without having to connect through a subsequently formed metal layer. Like the thin dielectric polysilicon to substrate or polysilicon to doped well capacitor charge passage device 714 (FIG. 28), the charge passage device 724 using buried contacts 726 has the advantage of already existing in the memory device 760 as soon as the polysilicon layer deposition begins, thereby providing a charge passage device 724 for dissipating charge during polysilicon processing. In addition, layout space is conserved by the spine 722 incorporating the charge passage device 724.

Figure 31:
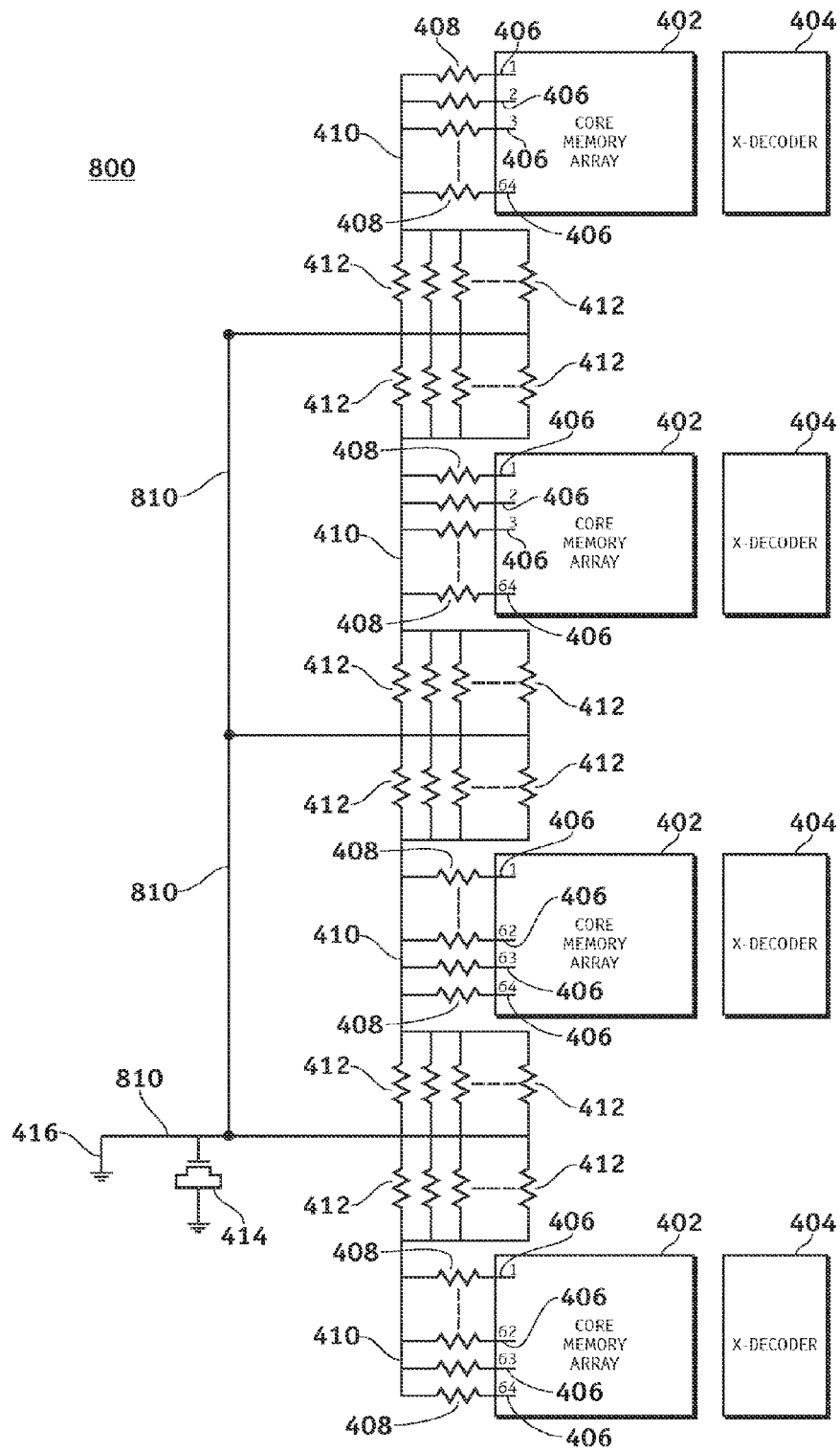
FIG. 31 is a schematic diagram of a charge dissipation protection circuit in accordance with a tenth memory embodiment of the present invention.
Figure 32:
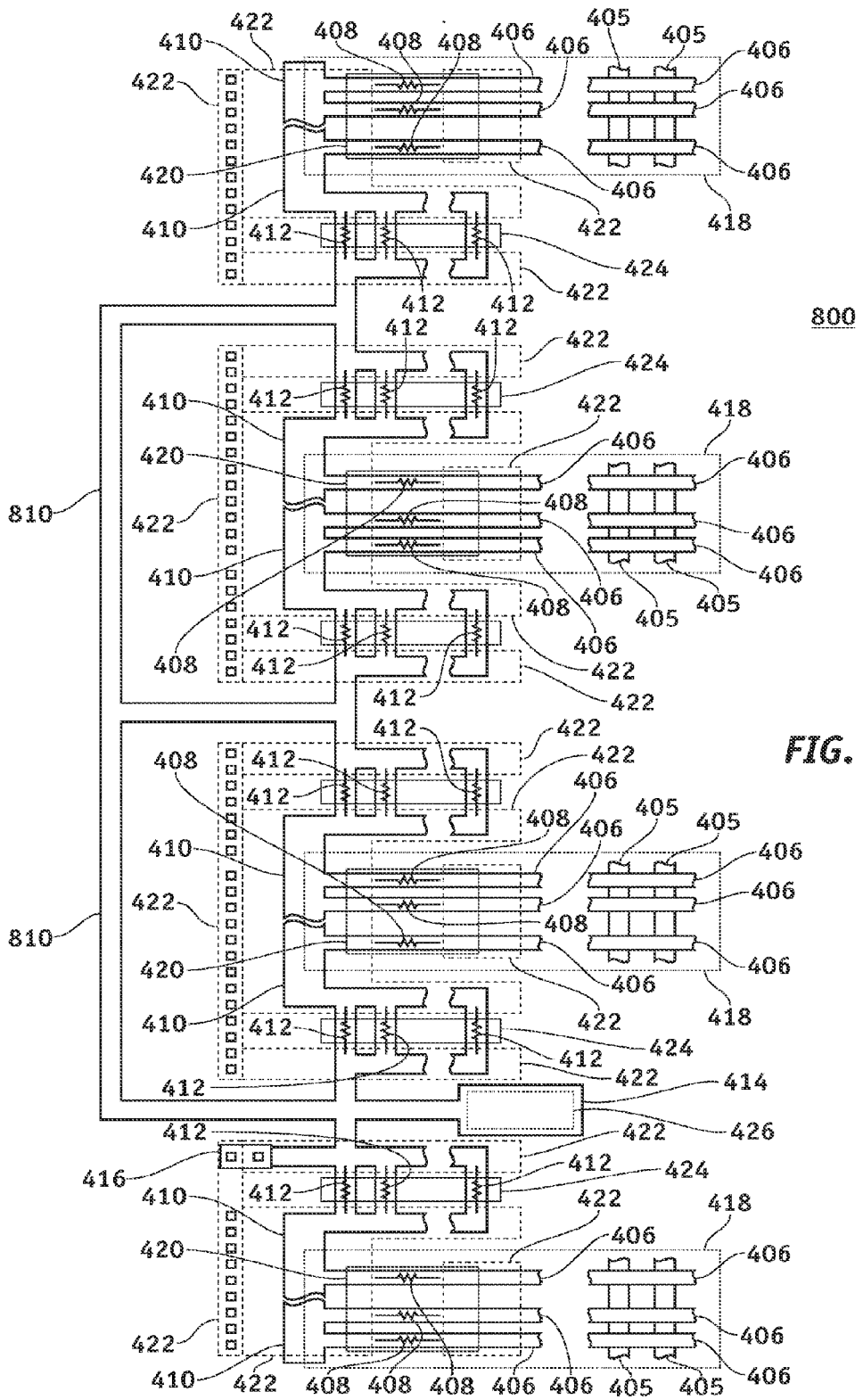
FIG. 32 is a layout view of a charge dissipation protection circuit in accordance with the tenth memory embodiment of the present invention.

Referring to FIGS. 31 and 32 a schematic diagram and a layout view, respectively, of a memory device 800 in accordance with a tenth memory embodiment of the present invention are shown. The memory device 800 derives from combining portions of four instances of the memory device 400 from the first memory embodiment of the present invention (FIGS. 9 and 10). In memory device 800, portions of several memory devices 400 are joined at a common interconnection node 810.

Interconnection node 810 is connected to ground via the first charge passage device 414 and the second charge passage device 416. Charge passage devices 414 and 416 in the tenth memory embodiment function in a like fashion to the charge passage devices 414 and 416 in the first memory embodiment of the present invention (FIGS. 9 and 10). In the tenth memory embodiment, spines 410, resistors 408 and 412 and word lines 406 function in the same manner as do their counterparts in the first memory embodiment.

The interconnect at interconnection node 810 is composed of polysilicon. By using polysilicon for this interconnection node 810 (i.e., spine 810), protection against in-process charging commences immediately after deposition of the polysilicon layer. Moreover, this protection already exists and is functioning before the polysilicon layer is patterned and etched. Thus, charge developed on memory array word lines 406 during the polysilicon etch processing step is safely shunted to ground via resistors 408, spines 410, resistors 412, the polysilicon interconnection node 810 and the charge passage devices 414 and 416.

The tenth memory embodiment has the advantage of allowing several core memory arrays 402 (FIGS. 9 and 31) to share as few as one charge passage device 414 and as few as one charge passage device 416. By sharing charge passage devices among several memory arrays 402, as shown in FIG. 31, the tenth memory embodiment accommodates the same amount of memory as several instances of memory device 400, as shown in FIG. 9, without using as much layout space for charge passage devices as do the several separate instances of memory device 400.

The layouts of shared charge passage devices 414 and 416 of the memory device 800 are typically optimized for shared operation. This optimization involves increasing the size of the thin oxide capacitor area in the charge passage device 414 of memory device 800 over the size of the charge passage device 414 in memory device 400. The area of the thin oxide capacitor is increased to accommodate the increased amount of in-process charging associated with the larger number of word lines 406 in the increased number of core memory arrays 402 protected by the charge passage device 414 of memory device 800. The conductivity of device 416 of memory device 800 can be similarly increased as needed by adding contacts to its two ends.

Figure 33:
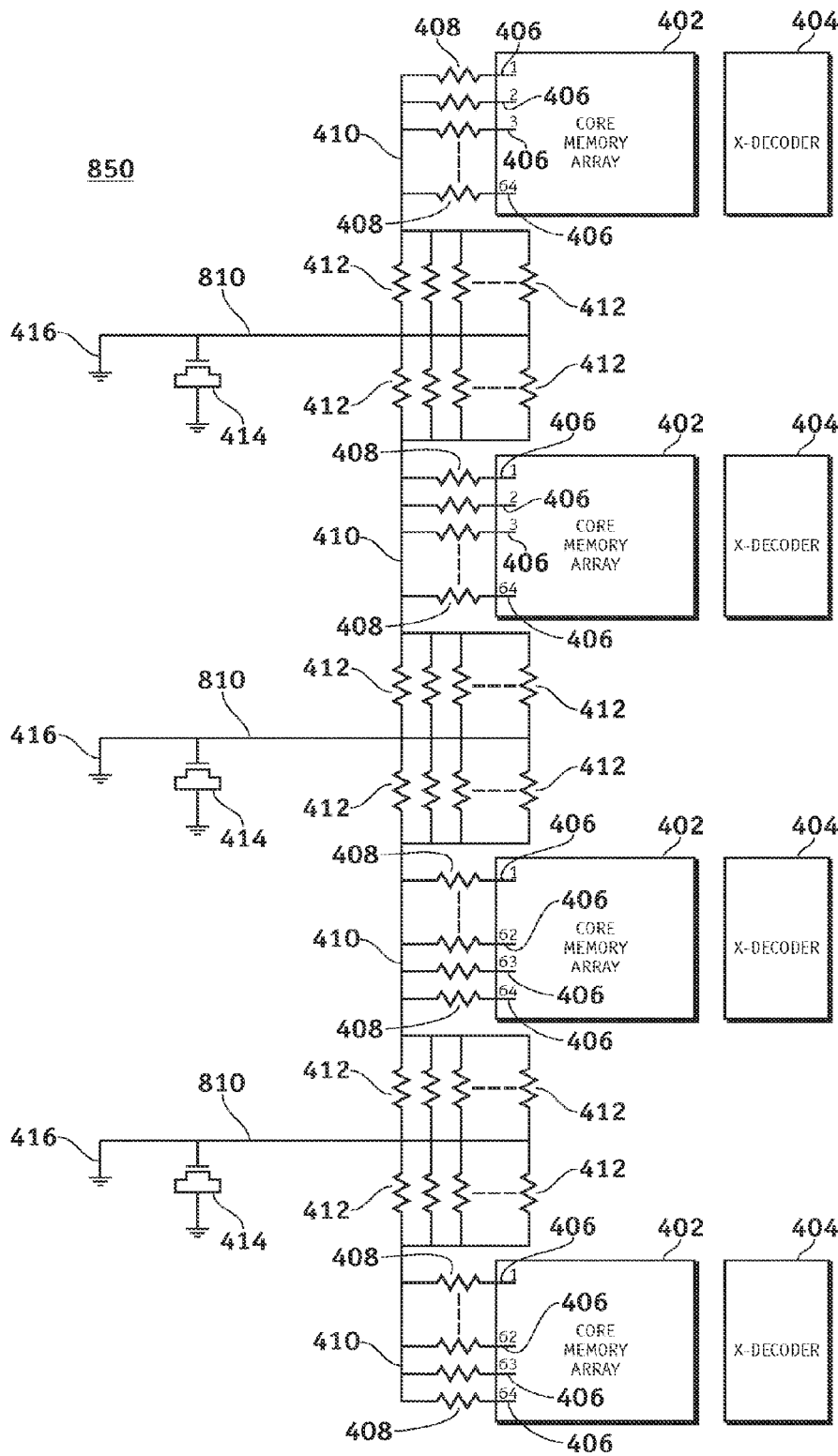
FIG. 33 is a schematic diagram of a charge dissipation protection circuit in accordance with an eleventh memory embodiment of the present invention.
Figure 34:
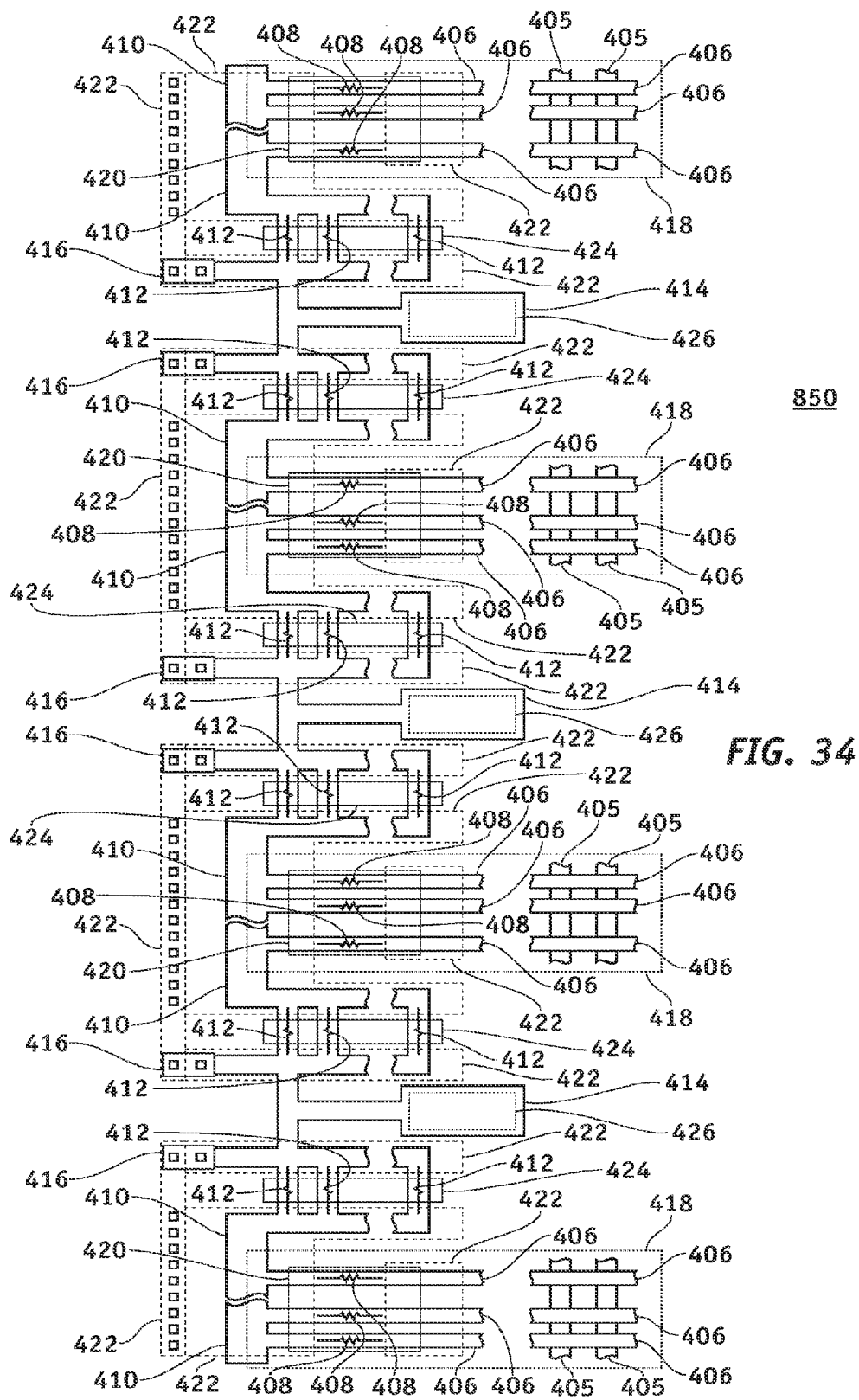
FIG. 34 is a layout view of a charge dissipation protection circuit in accordance with the eleventh memory embodiment of the present invention.

Referring to FIGS. 33 and 34 a schematic diagram and a layout view, respectively, of a memory device 850 in accordance with an eleventh memory embodiment of the present invention are shown. Memory device 850 is similar to memory device 800 in the tenth memory embodiment except that memory device 850 uses three instances of charge passage device 414 and three instances of charge passage device 416 to provide protection against damage due to in-process charging of the word lines 406 in four core memory arrays 402. This particular embodiment is optimized for small layout area and layout convenience in MirrorBit memories and the sharing of charge passage devices in memory device 850 allows the embodiment to be laid out more easily and the embodiment's layout to occupy less layout space.

The size advantages of memory devices 800, 850 hold even when the charge passage devices 414 and 416 used in memory devices 800, 850 are larger than the charge passage devices 414 and 416 used in memory device 400 (FIGS. 9 and 10). In addition to requiring fewer charge passage devices, the size advantages of memory devices 800, 850 over memory device 400 are also realized because a small number of larger charge passage devices 414 (in memory devices 800 and 850) more efficiently pass charge than do a large number of smaller charge passage devices 414 (as in memory device 400). Efficiency is defined here as the charge passage capacity divided by the amount of layout area consumed by the devices that pass that charge. For example, two smaller charge passage devices 414, each having half the thin oxide area of a single large charge passage device 414 (and each thus having half of the charge passage capability), require a larger total layout space than does the single large charge passage device 414. The larger device's advantage is due to minimum device to device spacing requirements and to the other layout overhead effects that would occur at device edges in the two smaller charge passage devices. Similarly, two smaller charge passage devices 416, each having one half of the conductivity of a single larger charge passage device 416, require more overall layout space than does the single larger charge passage device 416.

Note that, although the particular instances of memory device 800 shown in FIGS. 31 and 32 and memory device 850 shown in FIGS. 33 and 34 provide the same or better protection against damage due to in-process charging as four instances of memory device 400, the general memory devices 800 and 850 are not limited to connections to just four core memory arrays. Other versions of devices 800 and 850 could just as readily be implemented so as to protect a very large number (thousands for example) of core memory arrays against the effects of in-process charging.

In a similar manner to the procedure described for combining multiple instances of the first memory embodiment (FIGS. 9 and 10) to form a tenth and an eleventh memory embodiment (FIGS. 31 and 32 and FIGS. 33 and 34), multiple instances of the second memory embodiment described previously in FIGS. 13 and 14 are combined to form a twelfth and a thirteenth memory embodiment. Again, one or more charge passage devices 414 are shared among the protection circuits for two or more core memory sectors. Similarly, one or more charge passage devices 416 are shared among the protection circuits for two or more core memory sectors. One example of a circuit for the thirteenth memory embodiment merely consists of the circuit shown in FIG. 33 with the spine 410 of the memory embodiment shown in FIG. 13 substituted for each of the three spines 410 in FIG. 33. Each of the spines in the thirteenth memory embodiment also contains the resistors 602 shown in the spine 410 in FIG. 13.

Similarly, the relevant variations among the devices in the third through fifth memory embodiments shown in FIGS. 15 through 20 are substituted for their counterparts in the tenth and eleventh memory embodiments FIGS. 31, 32, 33 and 34 to form other memory embodiments. Example circuits for these various memory embodiments are created by simple substitution. The circuits for the fourteenth and fifteenth memory embodiments are created from the circuits in FIGS. 31 and 33 by substituting the buried contact charge passage device 612 of FIG. 15 for the charge passage device 414 in the circuit of FIG. 31 and for the charge passage devices 414 in the circuit of FIG. 33. The circuits for the sixteenth and seventeenth memory embodiments are created from the circuits of FIGS. 31 and 33 by substituting the high impedance polysilicon PIN diodes 622 of FIG. 17 for the high impedance resistors 408 in the circuit of FIG. 31 and for the high impedance resistors 408 in the circuit of FIG. 33. The circuit for the eighteenth memory embodiment is created from the circuit of FIG. 31 by first substituting the buried contact charge passage device 632 of FIG. 19 for the charge passage device 414 in the circuit of FIG. 31. This creates a modified version of the circuit shown in FIG. 31. This step is followed by substituting the high impedance polysilicon PIN diodes 622 of FIG. 19 for the high impedance resistors 408 in the modified version of the circuit in FIG. 31. This completes the eighteenth memory embodiment. Similarly, the buried contact charge passage device 632 of FIG. 19 is substituted for each of the charge passage devices 414 in the circuit shown in FIG. 33 to create a modified version of the circuit shown in FIG. 33. Then the PIN diodes 622 of FIG. 19 are substituted for the high impedance resistors 408 in the modified version of the circuit in FIG. 33. This completes the nineteenth memory embodiment.

Figure 35:
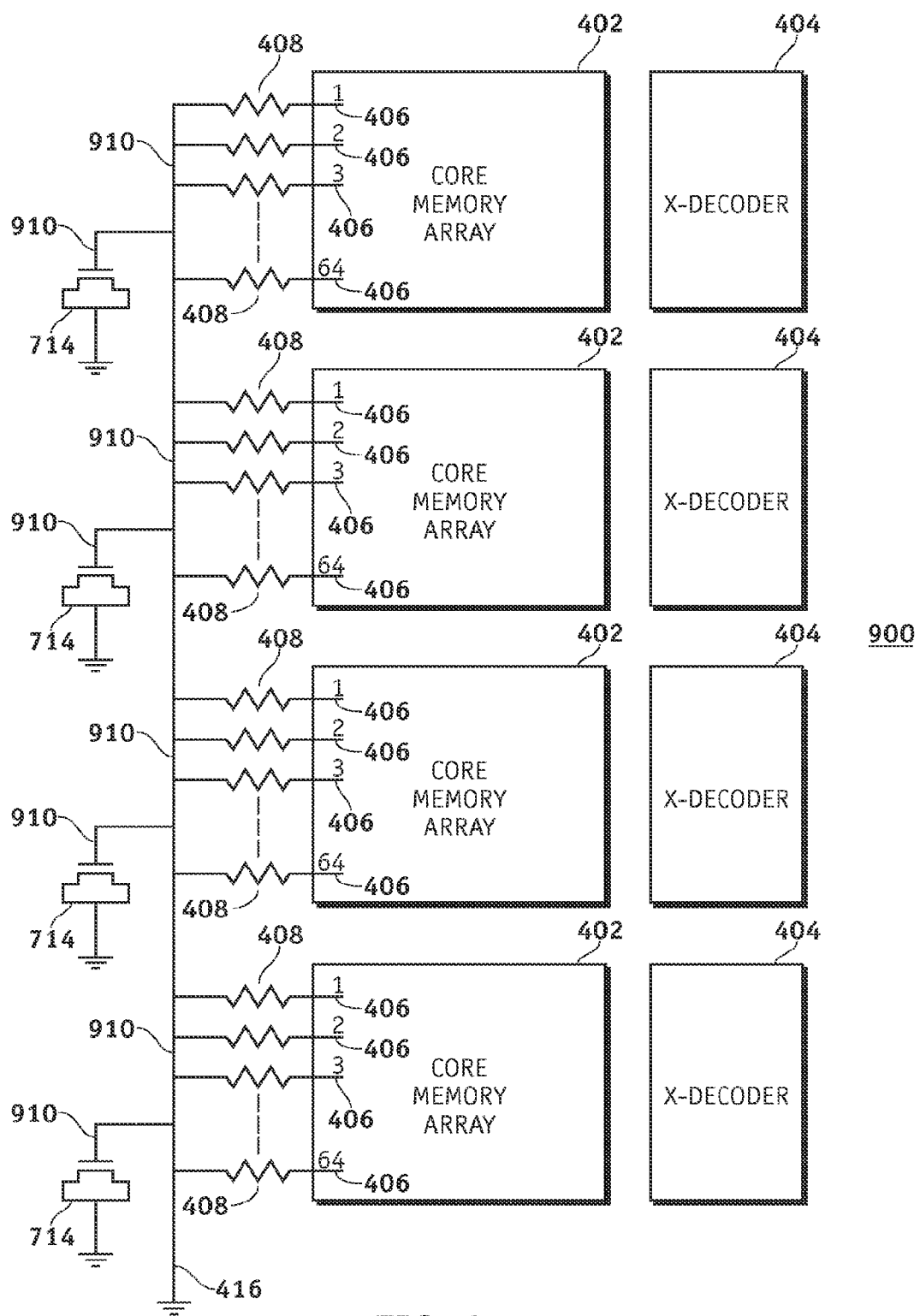
FIG. 35 is a schematic diagram of a charge dissipation protection circuit in accordance with a twentieth memory embodiment of the present invention.
Figure 36:
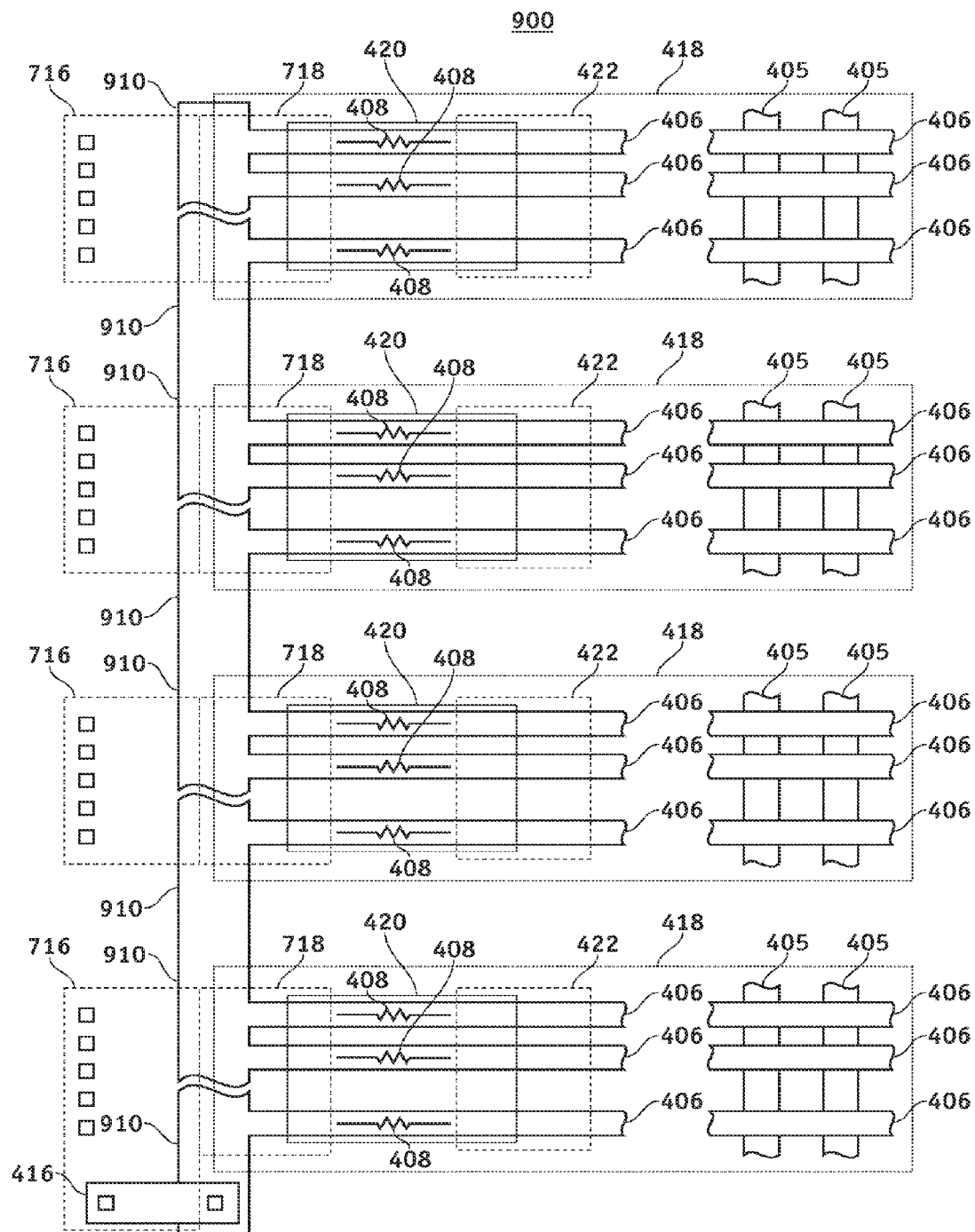
FIG. 36 is a layout view of a charge dissipation protection circuit in accordance with the twentieth memory embodiment of the present invention.

Referring to FIGS. 35 and 36 a schematic diagram and a layout view, respectively, of a memory device 900 in accordance with a twentieth memory embodiment of the present invention are shown. The particular memory device 900 derives from combining portions of four instances of the memory device 700 from the sixth memory embodiment of the present invention (FIGS. 23 and 24). In memory device 900, portions of several memory devices 700 are joined at a common node 910 as shown in FIGS. 35 and 36.

Similar to how the polysilicon spine 710 (FIGS. 23 and 24) in the sixth memory embodiment of the present invention serves as a charge passage device 714, the polysilicon spine 910 in the twentieth memory embodiment serves as several charge passage devices 714, i.e., the devices 714 that ground the spine 910 to the substrate or to a doped well. Referring to FIG. 36, the polysilicon spine 910 is formed over the top of several source-drain regions 716 residing in the substrate or in one or more doped wells in the substrate.

As in the sixth memory embodiment, in the twentieth memory embodiment the presence of polysilicon over a region of source-drain forms a thin gate oxide layer between the polysilicon and the source-drain region. The twentieth memory embodiment takes advantage of the thin gate oxide formation so that formation of the polysilicon in the spine 910 over the several source-drain regions 716 as shown in FIG. 36 results in the formation of several regions of thin gate oxide 718. These regions of thin gate oxide act as the charge passage devices 714 (FIG. 35). Thus charge passage devices 714 are thin gate oxide capacitors and are incorporated into spine 910. The thin gate oxide 718 allows the passage of process-induced charge that has accumulated on the memory word lines 406 either by carrier tunneling or through oxide breakdown.

The dielectric in the thin gate oxide charge passage devices 714 formed from the deposition of the polysilicon over the source-drain regions 716 is significantly thinner than the gate dielectric of the oxide-nitride-oxide layer 418 of the Mirror-Bit core transistors being protected. The thinner dielectric oxide of charge passage device 714 ensures that device 714 will pass charge much more readily than will the thicker oxide-nitride-oxide gate dielectric of the core cells being protected. In this way the spine serves not only in its previously mentioned role (see 410 in FIGS. 9, 10 and 13 through 22) of linking the resistors 408 together but also acts as the charge passage devices 714.

By using polysilicon for this interconnect (for this spine 910), the protection of the device 900 against in-process charging commences immediately after deposition of the polysilicon layer. Moreover, this protection already exists and is functioning before the polysilicon layer is patterned and etched. Thus, charge developed on memory array word lines 406 during the polysilicon etch processing step is safely shunted to ground via resistors 408, spines 910 and the charge passage devices 714.

Charge passage devices 714 in the twentieth memory embodiment 900 function in a like fashion to the charge passage device 714 in the sixth memory embodiment of the present invention (FIGS. 23 and 24). In the twentieth memory embodiment 900, spines 910, resistors 408 and word lines 406 also function in similar manners to their counterparts in the sixth memory embodiment (FIGS. 23 and 24).

Together, the spine 910 with its charge passage devices 714 formed partially in the poly-silicon, the word lines 406 formed in the polysilicon, and the word line protection resistors 408 formed in the polysilicon are adequate for protecting the gates of the MirrorBit core transistors from the damaging levels of process-induced charge that would otherwise accumulate on the core transistor word lines 406 during polysilicon etching, wherein the core transistor word lines 406 form the gates of the MirrorBit core transistors.

Added protection against process-induced charging is acquired during the first metallization step with the addition of a connection 416 through metal and contacts from the polysilicon in the spine 910 to the substrate or from the polysilicon in the spine 910 to a doped well residing in the substrate. This added connection 416 protects against charging that can occur in processing that is subsequent to the first metal layer processing. Charge passage device 416 in the twentieth memory embodiment depicted in FIGS. 35 and 36 functions in a like fashion to the charge passage device 416 in the sixth memory embodiment of the present invention as shown in FIGS. 23 and 24.

Significant layout space advantage is realized by the memory device 900 combining several spines 710 (FIGS. 23 and 24) for several core memory arrays 402 (FIGS. 23 and 24) into one spine 910 (FIGS. 35 and 36) and then connecting that spine to ground through multiple charge passage devices 714 and as few as one charge passage device 416 (FIGS. 35 and 36). As compared with the sixth memory embodiment depicted in FIGS. 23 and 24, this sharing of a single charge passage device 416 among several instances of core memory arrays 402 (FIGS. 23 and 35) is key to saving layout space in the memory device 900 in the twentieth memory embodiment.

The layout of the shared charge passage device 416 of the memory device 900 is typically optimized for shared operation. This optimization involves increasing the conductivity of charge passage device 416 in memory device 900 relative to the conductivity of device 416 in memory device 700 (FIGS. 23 and 24) by adding contacts to device 416 in memory device 900. The conductivity of memory device 900's charge passage device 416 is increased to accommodate the increased amount of in-process charging associated with the larger number of word lines 406 in the increased number of core memory arrays 402 protected by memory device 900's charge passage device 416.

Despite adding these contacts to the charge passage device 416 of the memory device 900, the size advantage of the memory device 900 still holds even given the larger size of the charge passage device 416 of the memory device 900. The size advantage of the memory device 900 is realized partly because a single instance of a larger charge passage device 416 (in device 900) more efficiently passes charge than can a number of smaller charge passage devices 416 (as in device 700) where, as before, efficiency is defined as the charge passage capacity divided by the amount of layout area consumed by the devices that pass that charge. For example, two smaller charge passage devices 416, each having half the number of contacts of a single larger charge passage device 416 (and each thus having half of the charge passage capability), require a larger total layout space than does the single larger charge passage device 416.

The twentieth memory embodiment is optimized for small layout area and layout convenience in MirrorBit memories. The sharing of charge passage devices among multiple core memory arrays allows the twentieth embodiment to be laid out more easily and the layout thereof to occupy less layout space.

While the memory device 900 depicted in FIGS. 35 and 36 includes only one polysilicon spine 910 for the four memory arrays including word lines 406 one to sixty-four in each array, two polysilicon spines 910 could be provided for the memory arrays and each memory array could have more or less than sixty-four word lines 406. All of the polysilicon devices 406, 408, 910 are all portions of only one or two polygons of poly-silicon, each polygon including word lines 406, individual word line resistors 408, and one polysilicon spine 910. When two polysilicon spines 910 are provided for the memory arrays, then half of the word lines 406 in each array connect through high impedance thin film resistors 408 to one spine 910 and the other half of the word lines 406 connect through high impedance thin film resistors 408 to the other spine 910. Such a structure requires two polygons of polysilicon, each polygon containing half of the word lines 406, half of the individual word line resistors 408 and one polysilicon spine 910.

Note that, although the particular instance of memory device 900 shown in FIGS. 35 and 36 provides the same or better protection against damage due to in-process charging as four instances of memory device 700, the general memory device 900 is not limited to connections to just four core memory arrays. Other versions of device 900 could just as readily be implemented so as to protect a very large number (thousands for example) of core memory arrays against the effects of in-process charging.

In a similar manner to that described for combining multiple instances of device 700 of the sixth memory embodiment (FIGS. 23 and 24) to form the twentieth memory embodiment (FIGS. 35 and 36), multiple instances of the seventh memory embodiment described previously in FIGS. 25 and 26 are combined to form a twenty-first memory embodiment. Again, one or more charge passage devices 416 are shared among the protection circuits for two or more core memory sectors. One example of a circuit for the twenty-first memory embodiment merely consists of the circuit shown in FIG. 35 with the spine 722 of the memory embodiment shown in FIG. 25 substituted for the corresponding portions of the combined spine 910 in FIG. 35. In the twenty-first memory embodiment, the charge passage devices 714 in the circuit of FIG. 35 are replaced with the charge passage device 724 of FIG. 25. The charge passage device 724 has polysilicon to source-drain region 716 buried contacts 726 extending directly from the polysilicon layer to the underlying source-drain region 716.

Similarly, the relevant variations among the devices in the eighth and ninth memory embodiments shown in FIGS. 27 through 30 are substituted for their counterparts in the twentieth memory embodiment FIGS. 35 and 36 to form other memory embodiments. Example circuits for these various memory embodiments are created by simple substitution. The circuit for a twenty-second memory embodiment is created from the circuit in FIG. 35 by substituting the high impedance polysilicon PIN diodes 622 of FIG. 27 for the high impedance resistors 408 in the circuit of FIG. 35. The circuit for a twenty-third memory embodiment is created from the circuit in FIG. 35 by first substituting the buried contact charge passage device 724 of FIG. 29 for the charge passage devices 714 in the circuit of FIG. 35. This procedure creates a modified version of the circuit in FIG. 35. This substitution is followed by substituting the high impedance polysilicon PIN diodes 622 of FIG. 29 for the high impedance resistors 408 in the modified version of the circuit in FIG. 35.

While exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for forming a semiconductor device, comprising:
    providing a substrate;
    forming a charge passage device coupled to the substrate;
    forming one or more thin film devices coupled to the charge passage device, wherein at least one of the one or more thin film devices includes at least one high impedance thin film device; and
    forming an at least semiconductive layer connected to the one or more thin film devices, wherein in-process charges generated therein, during and since formation of the at least semiconductive layer is dissipated to the substrate through a connection provided by the one or more thin film devices and the charge passage device.

2. The method of claim 1 further including:
    doping the substrate to form a doped well therein, and wherein the the charge passage device is configured to be coupled to the doped well.

3. The method of claim 1 wherein the forming the one or more thin film devices comprises:
    depositing a semiconductive layer; and
    doping at least portions of the semiconductive layer to form one or more high impedance thin film resistors.

4. The method of claim 1 wherein the forming the one or more thin film devices comprises:
    depositing a semiconductive layer; and
    doping at least portions of the semiconductive layer to form one or more high impedance thin film diodes.

5. The method of claim 4 further comprises:
    doping at least portions of the semiconductive layer to form one or more P+/Insulator/N+ (PIN) diodes.

6. The method of claim 1 further comprises:
    forming the one or more thin film devices and the at least semiconductive layer concurrently such that the one or more thin film devices are integrally formed in the at least semiconductive layer.

7. The method of claim 6 wherein the at least semiconductive layer includes a first portion and a second portion, wherein the one or more thin film devices are integrally formed in the second portion of the at least semiconductive layer to transport charge from the first portion through the second portion thereof to the charge passage device.

8. The method of claim 7 further comprises:
    depositing a polysilicon layer to form the first portion and the second portion of the at least semiconductive layer; and
    doping the second portion of the polysilicon layer to integrally form the one or more thin film devices therein.

9. The method of claim 7 further comprises:
    forming a gate of one or more transistors in the first portion of the at least semiconductive layer.

10. The method of claim 1 further comprises:
    forming a gate of one or more transistors in the at least semiconductive layer.

11. The method of claim 1 wherein the forming the at least semiconductive layer comprises:
    depositing a polysilicon layer.

12. The method of claim 1 wherein the forming the charge passage device comprises:
    forming a gate oxide capacitor.

13. The method for forming a semiconductor device of claim 1 further comprises:
    forming a spine connected to each of the one or more thin film devices and the charge passage device to provide the connection from the one or more thin film devices to the substrate to dissipate charge from the at least semiconductive layer to the substrate.

14. The method of claim 13 further comprises:
    forming one or more high impedance resistors connected between each of the one or more thin film devices to the spine.

15. The method of claim 1 wherein the charge passage device, the one or more thin film devices and the at least semiconductive layer are at least partially formed in a single polysilicon deposition processing step.

16. The method of claim 1 further comprising:
    shorting out the charge passage device before completing formation of the semiconductor device.

17. The method of claim 1 further comprising:
    forming memory core devices and periphery devices, and wherein
        the forming the charge passage device comprises epitaxially growing a gate oxide layer,
        the forming the at least semiconductive layer comprises depositing a first polysilicon layer, and
        the forming the one or more thin film devices comprises doping portions of the first polysilicon layer.

18. The method of claim 17 further comprising:
    depositing a second polysilicon layer;
    masking the first and the second polysilicon layers;

selectively doping the at least semiconductive layer to adjust the impedances of high impedance portions of the one or more thin film devices;

etching the periphery devices;

implanting the memory core devices and the periphery devices; and shorting the charge passage device before completing formation of the semiconductor device.

19. The method for forming a semiconductor device of claim 1 wherein the step of forming the charge passage device comprises the step of forming a buried contact.

20. The method for forming a semiconductor device of claim 1 wherein the step of forming the charge passage device comprises the step of forming a thin gate oxide charge leakage device for connecting the one or more thin film devices to the substrate.

21. The method for forming a semiconductor device of claim 20 wherein the step of providing the substrate comprises the step of providing a substrate including source-drain contacts and wherein the step of forming the charge passage device comprises the step of forming a metal layer for connecting the one or more thin film devices to the source-drain contacts.

\* \* \* \* \*